(12) United States Patent
Asano et al.

(10) Patent No.: US 6,495,847 B1
(45) Date of Patent: Dec. 17, 2002

(54) STAGE CONTROL APPARATUS AND EXPOSURE APPARATUS

(75) Inventors: Toshiya Asano; Mitsuru Inoue; Eiji Sakamoto, all of Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/469,516

(22) Filed: Dec. 22, 1999

(30) Foreign Application Priority Data

Dec. 24, 1998 (JP) .......................................... 10-367223
Aug. 24, 1999 (JP) .......................................... 11-237491
Oct. 26, 1999 (JP) .......................................... 11-304039

(51) Int. Cl.$^7$ ............................................. G03B 27/42
(52) U.S. Cl. ......................... 250/548; 356/400; 355/53
(58) Field of Search ............................. 250/548, 559.3; 356/399–401; 355/53, 55

(56) References Cited

U.S. PATENT DOCUMENTS

| | | | |
|---|---|---|---|
| 5,040,431 A | 8/1991 | Sakino et al. ................. 74/479 |
| 5,062,712 A | * 11/1991 | Sakuta et al. ............... 356/400 |
| 5,684,856 A | 11/1997 | Itoh et al. ...................... 378/34 |
| 5,907,390 A | 5/1999 | Sakamoto ..................... 355/30 |
| 5,909,272 A | 6/1999 | Osanai et al. ................. 355/53 |
| 5,917,580 A | 6/1999 | Ebinuma et al. .............. 355/53 |
| 6,211,946 B1 | * 4/2001 | Ohtomo et al. ............... 355/53 |
| 6,341,007 B1 | 1/2002 | Nishi et al. ................... 355/53 |

FOREIGN PATENT DOCUMENTS

JP              7-253304              10/1995

* cited by examiner

*Primary Examiner*—Stephone Allen
(74) *Attorney, Agent, or Firm*—Fitzpatrick, Cella, Harper & Scinto

(57) ABSTRACT

An exposure apparatus includes a projection optical system for projecting exposure light, with which a reticle formed with a pattern is irradiated, onto a wafer, a stage for holding and aligning the wafer or reticle, an alignment optical system for outputting alignment light, a reflection mirror provided on the stage, and a plurality of interferometers for measuring the position of the stage by irradiating the reflection mirror with measurement light. The interferometer to be used to measure the position of the stage in a predetermined direction is switched to another in accordance with whether the stage is aligned to the projection optical system or to the alignment optical system.

52 Claims, 23 Drawing Sheets

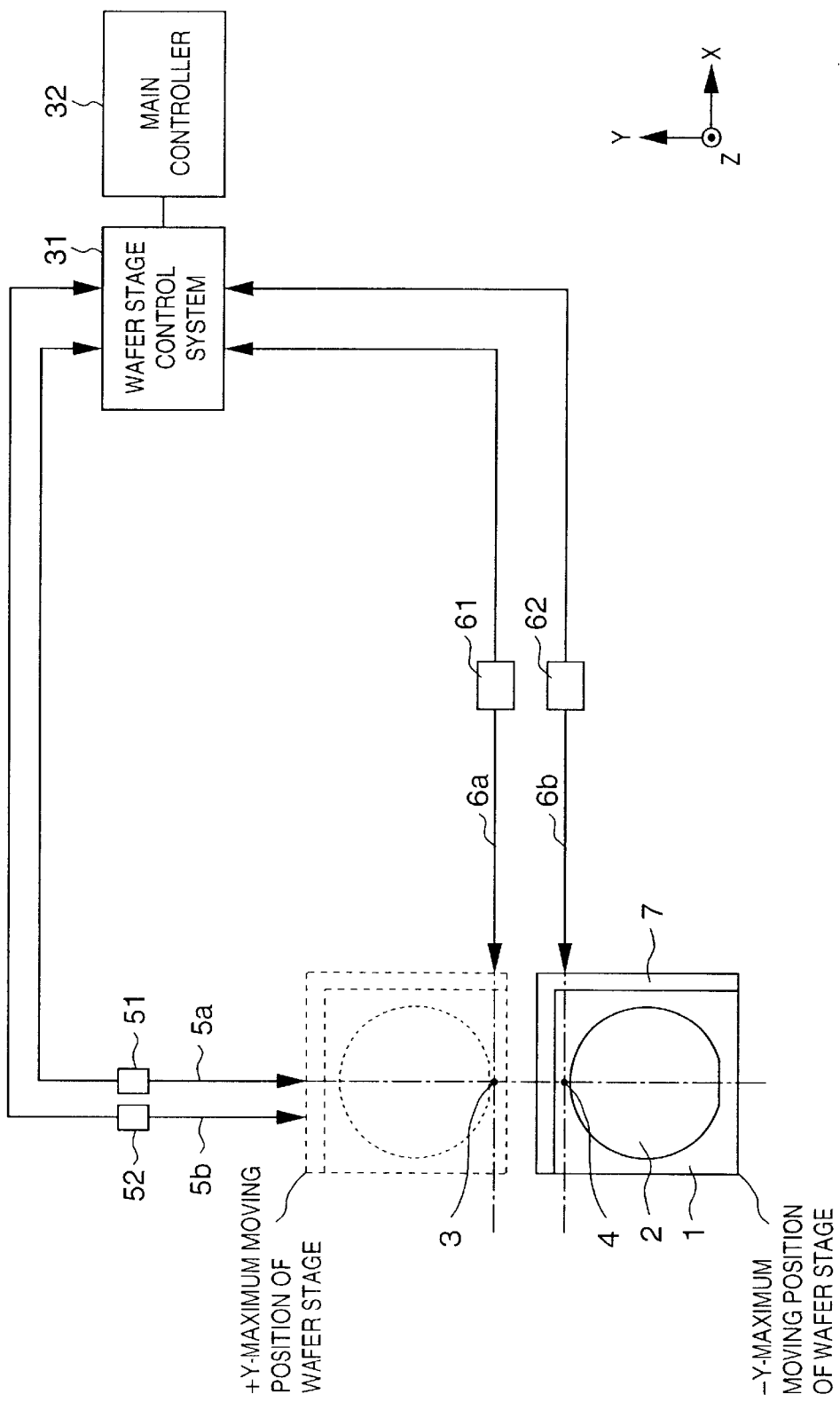

FIG. 2

RELATIONSHIP BETWEEN EXPOSURE PROCESSES AND WAFER STAGE POSITION MEASUREMENT

| PROCESS OF EXPOSURE APPARATUS | WAFER STAGE POSITION | INTERFEROMETER USED TO MEASURE STAGE POSITION |
|---|---|---|
| 1. LOAD NEW WAFER | NEAR ALIGNMENT MEASUREMENT POSITION | SECOND X-INTERFEROMETER |
| 2. PREALIGNMENT | NEAR ALIGNMENT MEASUREMENT POSITION | SECOND X-INTERFEROMETER |
| 3. ALIGNMENT | ALIGNMENT MEASUREMENT POSITION | SECOND X-INTERFEROMETER |
| 4. EXPOSURE | EXPOSURE POSITION | FIRST X-INTERFEROMETER |
| 5. ALIGNMENT | ALIGNMENT MEASUREMENT POSITION | SECOND X-INTERFEROMETER |
| 6. UNLOAD WAFER | NEAR ALIGNMENT MEASUREMENT POSITION | SECOND X-INTERFEROMETER |

STAGE CONTROL APPARATUS AND EXPOSURE APPARATUS

BACKGROUND OF THE INVENTION

The present invention relates to a stage apparatus which is used in a semiconductor exposure apparatus, inspection apparatus, or the like, and aligns an exposure master disk, an object to be exposed, or an object to be inspected to a predetermined position, and its control method.

In general, as exposure apparatuses used in the manufacture of semiconductor elements, an apparatus called a stepper, and an apparatus called a scanner are known. The stepper projects a pattern image formed on a reticle on a semiconductor wafer on a stage apparatus in a reduced scale via a projection lens while stepping the wafer beneath the projection lens, thus sequentially forming the pattern image by exposure on a plurality of portions on the single wafer. The scanner moves a semiconductor wafer on a wafer stage and a reticle on a reticle stage relative to a projection lens (scan movement), and projects a reticle pattern on the wafer by irradiating it with slit-patterned exposure light during the scan movement. The stepper and scanner are considered as mainstreams of the exposure apparatus in terms of their resolution and superposing precision.

FIG. 21 is a schematic top view of a wafer stage used in such an exposure apparatus.

A wafer 102 to be exposed is mounted on a wafer stage 101 via a wafer chuck (not shown). With reference to an exposure optical system, the position of an exposure optical axis 103 is fixed in FIG. 21. Hence, the wafer stage 101 must move in the X- and Y-directions with respect to the exposure optical axis 103 to expose the entire surface of the wafer. The wafer 102 must also move in the Z- and tilt directions to adjust the imaging focal point, but a detailed description thereof will be omitted herein. The position measurement of the wafer stage 101 in the X- and Y-directions uses a high-resolution laser interferometer to realize high-precision alignment. In order to use the laser interferometer, a reflection mirror 107 for reflecting a laser beam must be provided on the wafer stage 101. However, since this reflection mirror 107 must reflect the laser beam to cover the entire moving range of the wafer stage 101, it requires a length equal to or larger than the moving distance of the wafer stage 101. That is, if Ly represents the stage moving distance in the Y-direction, the length Lx of a reflection mirror for X-measurement requires Ly or more (=Ly+α).

The moving range of the wafer stage 101 need only be slightly larger than the wafer diameter if exposure alone is done. However, in practice, the wafer stage 101 moves not only in an exposure operation but also in other operations.

In order to expose the wafer 102, alignment must be done with high precision with respect to the imaging point. Various alignment methods are available, and a method that irradiates an alignment mark, which has been exposed and transferred onto a wafer in advance, with alignment light to obtain any alignment error amount from light reflected by the mark is prevalently used. In this alignment method, the alignment optical axis center does not often match the exposure optical axis center.

FIG. 22 shows a general wafer stage when an alignment optical axis center 104 does not match the exposure optical axis center 103. Referring to FIG. 22, the alignment optical axis center 104 strikes a wafer at a position a given distance L2 from the exposure optical axis center 103. The wafer stage 101 must move the wafer 102 in the X- and Y-directions to expose the entire surface of the wafer, and must also move it in the X- and Y-directions to irradiate the entire surface of the wafer with the alignment light 104.

For this purpose, the movable range of the wafer stage 101 must be broadened by the displacement between the alignment optical axis 104 and exposure optical axis 103. Consequently, the length of the reflection mirror 107 must be increased by the broadened size of the moving range of the wafer stage.

Referring to FIG. 22, a length Lx2 of the reflection mirror in the X-direction must be increased by a displacement L2 between the alignment optical axis 104 and exposure optical axis 103.

More specifically, in FIG. 22, assume that an X-interferometer optical axis 105 passes through the exposure optical axis center 103, and a Y-interferometer optical axis 106 passes through the exposure optical axis center 103 and alignment optical axis center 104. Let Ly be the stage moving distance in the Y-direction (the distance between the position (solid line) where the wafer stage 101 has moved a maximum distance in a +Y-direction, and the position (broken line) where the stage 101 has moved a maximum distance in a −Y-direction), and L2 be the distance between the exposure optical axis center 103 and alignment optical axis 104. Then, the minimum required length Ly2 of the reflection mirror 107 is given by Ly2=Ly+L2.

Especially, in recent years, the wafer diameter becomes as large as 300 mm to improve productivity. In order to expose the entire surface of the wafer, the wafer stage must have a moving range at least equal to or larger than the wafer diameter. As the wafer alignment position may be different from the exposure position, and wafers must be exchanged, the moving range must be further broadened. Inevitably, the length of the reflection mirror increases.

However, a reflection mirror 107 having such a large length is not preferable since (1) it is hard to prepare a long reflection mirror having a high-precision mirror surface, (2) high cost is required to prepare the mirror surface of such a long reflection mirror, (3) the weight of the reflection mirror itself increases and results in an increase in total weight of the stage, (4) heat produced by a stage driving device increases due to an increase in stage weight, and (5) the characteristics of a control system deteriorate due to a decrease in natural frequency of a mechanical system of the stage.

In order to solve this problem, an arrangement described in Japanese Patent Laid-Open No. 7-253304 has been proposed. This apparatus comprises a laser interferometer distance measuring device, movable mirror, X-Y moving stage, and arithmetic device. The movable mirror has a length shorter than the stage moving distance in the Y-direction, and a plurality of X-interferometers are provided. The spacing between neighboring X-interferometers is shorter than the length of the movable mirror, and the movable mirror is irradiated with measurement light of one of the X-interferometers independently of the current position of the stage and is sometimes irradiated with measurement light from two X-interferometers. Which of the X-interferometers is ready to measure is determined by the arithmetic device based on the value of a Y-interferometer, and a measurement result in the X-direction is obtained. Upon moving the stage in the Y-direction, a new X-interferometer which becomes ready to measure undergoes recovery operation at a predetermined position using the value of the interferometer that has been used in measurement so far. By passing the values in turn, movement over a broad range is measured using the short movable mirror.

According to the arrangement described in Japanese Patent Laid-Open No. 7-253304, size and weight reductions of a position measurement mechanism (reflection mirror) to be mounted on a stage can be achieved. However, since the plurality of interferometers are selectively used, the process throughput lowers, and the measurement precision is not sufficiently high. According to the findings of the present inventors, such shortcomings are caused for the following reasons.

The recovery operation of each interferometer requires a certain time, and cannot fall within one sample time of a stage control system. Hence, even by the recovery operations of the interferometers like in the conventional system, measurement values cannot be continuously passed to a control system.

The X-Y stage must be aligned with high precision, and alignment is done by a control system that uses feedback of the measurement value of the stage position. The stage control system comprises a digital control system based on high-frequency sampling, and uses high-gain feedback. Observation noise of a position measurement system is disturbance to the control system, and if its influence is serious, the closed loop characteristics of the control system cannot be improved.

Oscillation noise inevitably appears in the measurement value of the laser interferometer. Such noise is produced due to electrical noise in the measurement system and mechanical vibration of the reflection mirror and laser interferometers themselves. Hence, upon passing the interferometer value, a value on which this noise is superposed is passed. For example, when the stage is aligned to stop near the switching position of the laser interferometers, chattering including a large number of times of switching of laser interferometers and value passing may occur due to slight vibration of the stage and noise of the switching position measurement system. When the value on which noise is superposed is passed a large number of times, errors accumulate, and the measurement error between the true stage position and the measurement value may become large.

SUMMARY OF THE INVENTION

It is, therefore, an object of the present invention to attain size and weight reductions of a position measurement mechanism (e.g., a reflection mirror and linear scale) mounted on a stage even when the moving range of the stage is broadened.

It is another object of the present invention to minimize deterioration of the position measurement precision resulting from switching of position measurement means by switching the position measurement means in units of predetermined work regions (e.g., exposure process regions, alignment regions) so as to reduce the number of times of switching of the position measurement means.

It is still another object of the present invention to provide an arrangement which can attain size and weight reductions of a position measurement mechanism mounted on the stage and can measure the stage position with high precision, even when the moving range of the stage is broadened.

It is still another object of the present invention to prevent the position measurement means from being switched frequently due to vibration of the stage even when the stage is stopped near the switching position of the position measurement means.

It is still another object of the present invention to obviate the need for increasing the length of an object required in position measurement such as a reflection mirror, linear scale, and the like to be mounted on the stage even when the alignment optical axis and exposure optical axis are separated from each other in an exposure apparatus and a device manufacturing method using that apparatus, and to improve the process throughput and position measurement precision.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1 is a schematic top view of a wafer stage according to the first embodiment of the present invention;

FIG. 2 is a table showing the relationship between the processes in an exposure process and wafer stage position measurement in the first embodiment of the present invention;

DETAILED DESCRIPTION OF THE PREFERRED EMBODIMENTS

Preferred embodiments of the present invention will now be described in detail in accordance with the accompanying drawings.

First Embodiment

Figure 23:
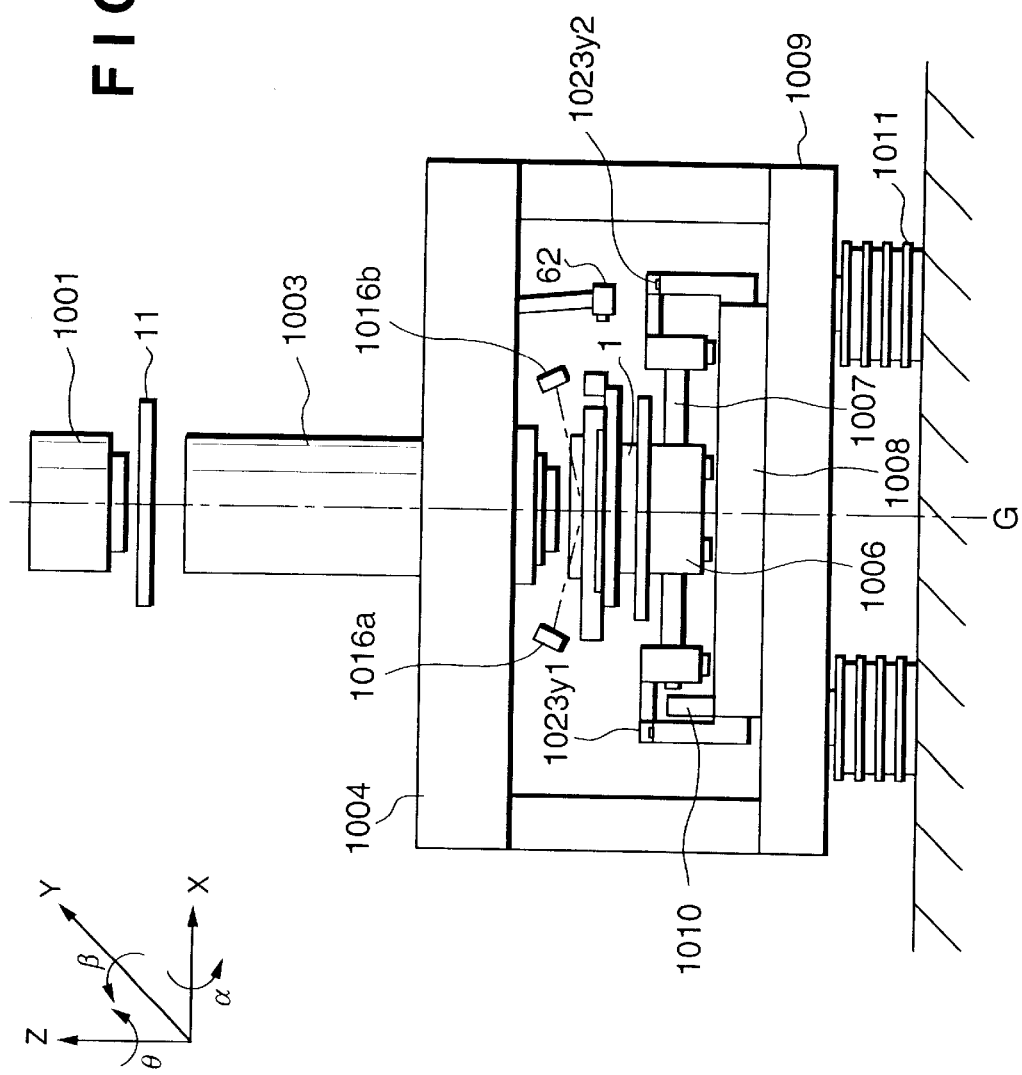
FIG. 23 shows a front view of an exposure device according to the first embodiment.

FIG. 23 is a front view of an exposure device to which a stage device according to the first embodiment can be applied.

In FIG. 23, reference numeral 11 is a reticle stage which mounts a reticle having a pattern to be copied, 1001 is an illumination unit, which illuminates the reticle with exposure light, and which includes a light source, an illumination lens, etc. 1003 is a projecting lens, which projects the pattern of the illuminated reticle onto a wafer at a certain rate of reduction, and 1004 is a lens-barrel holder, which holds the projecting lens 1003.

Reference numeral 1 is a wafer stage for placement of a wafer (not shown), and is structured so as to be movable in θ, z, α, and β directions. Reference numeral 1006 is an X-Y stage, which holds the top stage 1, and which is movable in X and Y directions, and 1007 is a movable guide, which supports the X-Y stage 1006 in the Y direction, without touching it, through a static pressure gas bearing unit, and guides the X-Y stage 1006 so as to be movable in the X direction. Reference numeral 1008 is a stage base whose upper surface is a guide surface, and supports the X-Y stage 1006 and the movable guide 1007 in the Z direction, without touching them, through a static pressure gas bearing unit, and 1010 is a yaw guide integrally attached to the stage base 1008, which supports the movable guide 1007 in the X direction, without touching it, through a static pressure gas bearing unit, and guides the movable guide 1007 so as to be movable in the Y direction. Stators of a linear motor for driving the X-Y stage 1006 in the X direction (not shown) are fixed to the movable guide 1007. Movable elements of the linear motors are attached to the X-Y stage 1006. Stators of a linear motor for driving the movable guide 1007 in the Y direction (not shown), are fixed to opposite sides of the stage base. Reference numerals 1023y1 and 1023y2 are movable elements of the movable guide 1007 in the Y direction, and are fixed to opposite sides of the movable guide 1007.

Reference numeral 1009 is a platform which holds the stage base 1008, and the platform 1009 and the stage base 1008 are integrally fixed to each other. Further, the platform 1009 and the lens-barrel holder 1004 are integrally lined together. Reference numeral 1011 are air mounts (vibration absorbing mechanism) located in four places to support the lens-barrel holder 1004. The air mounts 1011 insulate the lens-barrel holder 1004 and the platform 1009 from vibration transmitted from the floor. Incidentally, there is no limitation to four air mounts; it is sufficient if there are at least three air mounts.

Reference numeral 62 is a laser interferometer provided on the lens-barrel holder 1004, for measuring the relative positions of the projecting lens 1003 and the X-Y stage 1006. Reference numeral 1016a is a light projector of a focus detecting unit which measures the distance between the focus position of the projecting lens 1003 and the upper surface of the wafer, and 1016b is a photoreceptor of the focus detecting unit. The light projector 1016a and the photoreceptor 1016b are fixed to the projecting lens 1003.

FIG. 1 is a schematic top view of a wafer stage according to the first embodiment of the present invention.

A silicon wafer 2 is mounted on a wafer stage (or table) 1 via a wafer chuck (not shown). The wafer stage 1 is supported to be movable with respect to a surface plate (not shown) in the X-, Y-, and Z-directions, and rotation directions about the individual axes, and comprises linear motors (not shown) as actuators for driving the wafer stage in the respective moving directions.

An alignment optical system is constructed in the neighborhood of a projection optical system. The alignment optical system uses alignment light having a wavelength different from that of exposure light. An exposure optical axis center 3 does not-match an alignment optical axis center 4, which is located at a position separated from the exposure optical axis center 3 on the Y-axis.

Laser interferometers 51, 52, 61, and 62 are used to measure the positions of the wafer stage 1. The first Y-interferometer 51 for Y-position measurement of the wafer stage measures the position of the wafer stage 1 using reflected light of measurement light 5a, which strikes a reflection mirror 7 from the Y-direction to pass through the exposure optical axis center 3 and alignment optical axis center 4. The first X-interferometer 61 for X-position measurement of the wafer stage upon wafer exposure (to be referred to as X-position measurement upon exposure hereinafter) measures the position of the wafer stage 1 using reflected light of measurement light 6a, which strikes the reflection mirror 7 from the X-direction to pass through the exposure optical axis center 3. The second X-interferometer 62 for X-position measurement upon alignment measurement (to be referred to as X-position measurement upon alignment hereinafter) measures the position of the wafer stage 1 using reflected light of measurement light 6b, which strikes the reflection mirror 7 from the X-direction to pass through the alignment optical axis center 4.

The second Y-interferometer 52 measures rotation (to be referred to as θz hereinafter) in the Z-direction in cooperation with the first Y-interferometer 51. Note that light sources for the measurement light beams 5a, 5b, 6a, and 6b are not shown.

Also, three laser interferometers (not shown) are provided for Z-position measurement and X- and Y-rotations (to be referred to as θx and θy hereinafter) of the wafer stage 1. Note that Z, θx, and θy measurements of the wafer stage 1 may be attained by, e.g., optical or magnetic linear scales in place of the laser interferometers.

The wafer stage 1 is aligned with high precision by a wafer stage control system 31 on the basis of the position measurement values that pertain to the wafer stage 1 and a position target value command to the wafer stage 1.

The positions of the first X-interferometer 61 for X-position measurement upon exposure and the second X-interferometer 62 for X-position measurement upon alignment, and the size of the reflection mirror 7 placed on the wafer stage 1 have the following relationship.

The wafer stage 1 is required to have a moving range broad enough to expose the entire surface of the wafer 2. For this purpose, the reflection mirror 7 on the wafer stage 1 has a length large enough to allow the first X-interferometer 61 to measure the X-position of the wafer stage 1 at an arbitrary wafer stage position upon wafer measurement. Likewise, the reflection mirror 7 is required to have a length large enough to achieve alignment measurement of the entire surface of the wafer by the second X-interferometer 62 upon alignment measurement. For this reason, the reflection mirror 7 on the wafer stage 1 has a length large enough to attain X-position measurement of the wafer stage 1 by the second X-interferometer 62 at an arbitrary wafer stage position upon alignment measurement.

Conventionally, a single laser interferometer for X-measurement measures the position of the wafer stage 1 in the X-direction both upon wafer exposure and alignment measurement. However, the reflection mirror 7 provided on the wafer stage 1 is preferably as small as possible. In this embodiment, at least two interferometers for X-measurement of the wafer stage are provided, and the reflection mirror on the wafer stage is irradiated with measurement light corresponding to at least one of these interferometers.

Hence, the measurement light 6b of the second X-interferometer 62 for X-position measurement upon alignment may deviate from the reflection mirror 7 on a wafer stage moving region upon exposure (to be referred to as an exposure region hereinafter), and the measurement light 6a of the first X-interferometer 61 for X-position measurement upon exposure may deviate from the reflection mirror 7 on a wafer stage moving region upon alignment measurement (to be referred to as an alignment region hereinafter) Since a laser interferometer cannot measure position as an absolute value, once the measurement optical axis of the interferometer deviates from the reflection mirror, the origin (zero point) of the wafer stage 1 must be redetected using another sensor or physical abutment. In this embodiment, since the length of the reflection mirror 7 is larger than the spacing between the measurement light 6a of the first X-interferometer 61 and the measurement light 6b of the second X-interferometer 62, the reflection mirror 7 is always irradiated with the measurement light from either interferometer, and both the measurements are never disabled at the same time. Therefore, even when the measurement optical axis of either one interferometer departs from the reflection mirror 7 and measurement of that interferometer is disabled, when the wafer stage 1 reaches a position where the reflection mirror 7 is irradiated with that measurement light, the measurement value of that interferometer can be re-set on the basis of the measurement value of the other interferometer and the θz measurement value.

Figure 3:
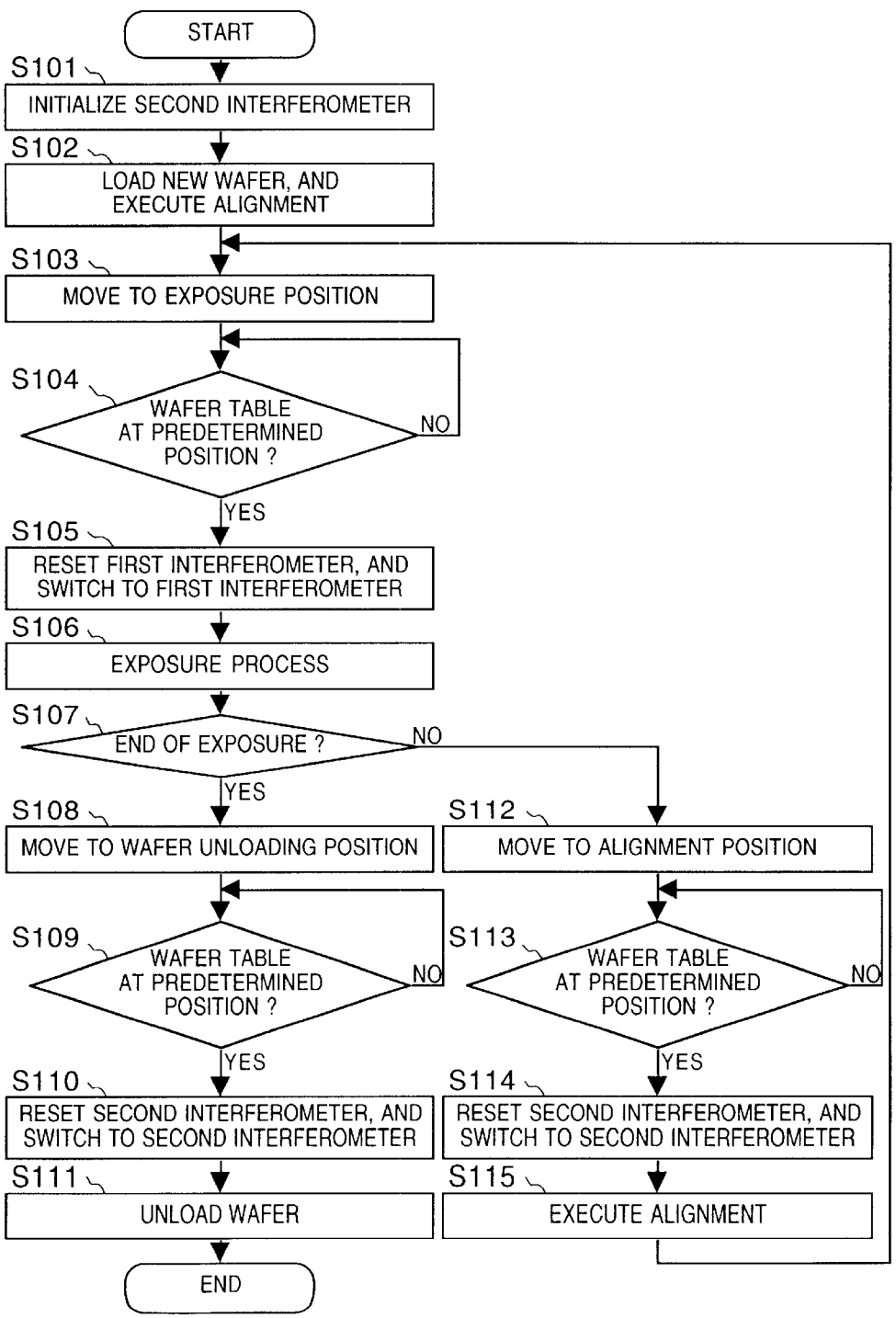
FIG. 3 is a flow chart for explaining the sequence of the exposure process according to the first embodiment of the present invention.
Figure 4:
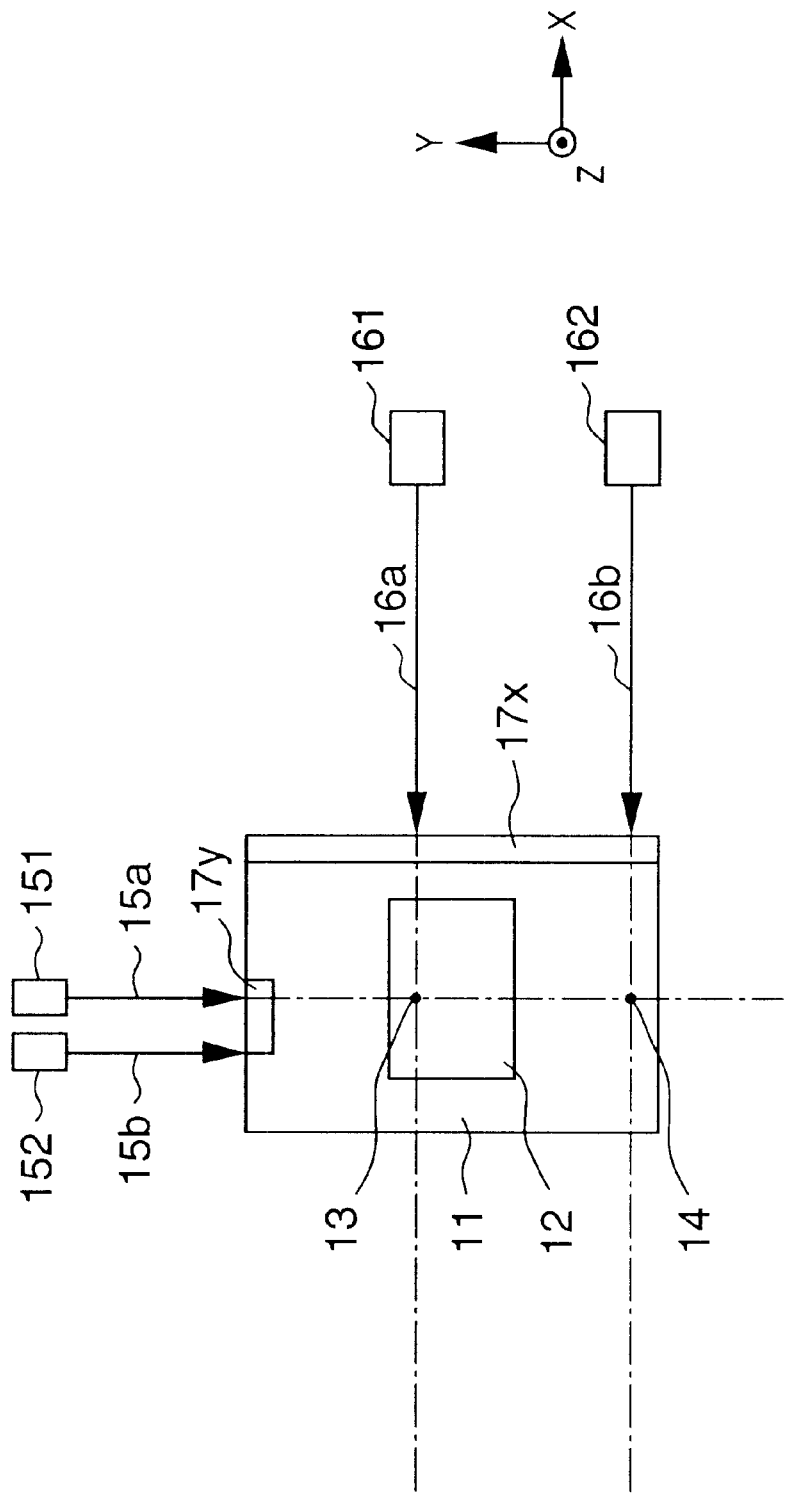
FIG. 4 is a schematic top view of a reticle stage according to the second embodiment of the present invention.

The exposure control sequence including the interferometer switching process according to this embodiment will be explained below. FIG. 2 is a table for explaining the flow of the processes in an exposure process for a single wafer, and FIG. 3 is a flow chart for explaining the exposure process according to this embodiment.

In step S101, the second X-interferometer 62 is initialized to become ready to use. In step S102, a new wafer is loaded. In this loading process, the wafer 2 to be exposed is chucked by the wafer chuck at a predetermined wafer exchange stage position (process 1). The wafer exchange stage position is set in the vicinity of the alignment measurement position. At this time, the second X-interferometer 62 for X-position measurement upon alignment has already undergone predetermined initialization in step S101, and is ready to measure the X-position of the wafer stage 1 at the wafer exchange stage position.

The direction of the orientation flat of the wafer 2 has been detected using a known orientation flat detection mechanism, and the wafer 2 has been roughly aligned to the wafer stage 1. The wafer stage 1 that mounts the wafer 2 moves to a predetermined location, and any position displacement of the wafer with respect to the wafer stage 1 is detected using a known prealignment scheme, thus making correction movement (process 2).

Subsequently, the alignment position of the wafer 1 is compensated for with high precision using the alignment optical system (process 3). In order to shorten the processing time per wafer, and to improve the throughput, global alignment that corrects position displacement by calculating a global wafer alignment correction amount on the basis of position displacement information at a plurality of sample points on a wafer, and then continuously makes exposure is more prevalent than die-by-die alignment that makes exposure by alignment for each exposure region. As described above, upon alignment measurement, since the second X-interferometer 62 can measure an arbitrary wafer stage position, the wafer stage control system 31 and a main controller 32 that controls the overall exposure apparatus use the measurement value of this interferometer.

Upon completion of alignment in this manner, the flow advances to step S103 to move the wafer stage 1 to an exposure position. The wafer stage control system 31 detects the Y-position of the wafer stage 1 using the first Y-interferometer during this movement to check if the wafer stage 1 has reached an interferometer switching position (step S104). When the wafer stage has reached a predetermined Y-position, the flow advances to step S105 to reset the first X-interferometer 61 to be ready to use. In step S106, an exposure process is executed.

Steps S103 to S106 described above will be explained in more detail. Upon completion of alignment, the wafer stage 1 moves to a first exposure position of the wafer 2 (process 4). Upon alignment measurement, the optical axis of the first X-interferometer 61 may depart from the reflection mirror 7, and the first X-interferometer 61 is not ready to use. During movement of the wafer stage 1 to the first exposure position (step S103), the measurement light of the first X-interferometer 61 strikes the reflection mirror 7 again, and the first X-interferometer 61 is ready to measure. Especially, as the position detected in step S104, a position where the measurement optical axes of both the first and second X-interferometers 61 and 62 hit the reflection mirror 7 on the wafer stage 1 is selected. Hence, a first X-interferometer measurement initial value required for recovery operation of the first X-interferometer 61 is calculated from the θz measurement value measured by the Y-interferometers (first and second Y-interferometers 51 and 52) and the measurement value of the second X-interferometer 62.

Note that in this recovery operation, the calculated first X-interferometer measurement initial value may be substituted in a counter of the first X-interferometer 61 to reset it, or the first X-interferometer 61 may be reset to zero using the calculated first X-interferometer measurement initial value as an offset and the wafer stage control system 31 or main controller 32 may use that value.

As described above, upon wafer exposure, since the first X-interferometer 61 can measure an arbitrary wafer stage position, the wafer stage control system 31 and main controller 32 use the measurement value of the first X-interferometer 61. Upon completion of predetermined exposure, the end of exposure of the wafer is checked (step 107). In a case of the end of exposure, the stage moves to a wafer exchange position by the processes in steps S108 to S111, and the wafer is unloaded from the wafer chuck (process 5).

These steps will be explained below. In step S108, the wafer stage begins to move to a wafer unloading position. In step S109, the first Y-interferometer 51 measures the position of the wafer stage 1 to check if the wafer stage 1 has reached a predetermined Y-position. If the wafer stage 1 has reached the predetermined position, the flow advances to step S110, and the interferometer to be used in X-position measurement is switched from the first X-interferometer 61 to the second X-interferometer 62. When the wafer stage 1 has reached the wafer unloading position, the wafer is unloaded, thus ending this process.

On the other hand, if some process operations still remain, an exposure process is made after the reticle is exchanged by another, or alignment is made again. That is, predetermined operations are repeated until the wafer process is complete (process 6).

In FIG. 3, alignment is made again in steps 3112 to S115. The wafer stage begins to move to an alignment position in step S112, and the first Y-interferometer 51 measures the position of the wafer stage 1 in step S113 to check if the wafer stage has reached a predetermined Y-position. If the wafer stage 1 has reached the predetermined position, the flow advances to step S114, and the interferometer used in X-position measurement is switched from the first X-interferometer 61 to the second X-interferometer 62. In step S115, a predetermined alignment process is executed, and the flow then returns to step S103 to execute the exposure process again.

Upon exposure, the measurement light of the second X-interferometer 62 for X-position measurement upon alignment deviates from the reflection mirror, and the second X-interferometer 62 is not ready to use. When the wafer stage moves to the wafer unloading stage position (step S108) upon completion of exposure, or when the wafer stage moves to the alignment position again (step S112), the same recovery operation of the second X-interferometer 62 as that of the first X-interferometer 61 is done (step S110 or S114). More specifically, the recovery operation is done by calculating a second X-interferometer measurement initial value required for the recovery operation of the X-interferometer 62 on the basis of the θz measurement value measured by the Y-interferometers (first and second Y-interferometers 51 and 52), and the measurement value of the first X-interferometer 61. In this manner, the wafer stage control system 31 and main controller 32 make control using the measurement value of the second X-interferometer for X-position measurement upon alignment. Upon completion of unloading of the wafer (process 6), the process of this wafer ends, and the process of the next wafer is started.

Note that the position of the wafer stage upon switching one of the measurement values of the first and second X-interferometers 61 and 62 to another (to be referred to as "interferometer switching" hereinafter) to be used by the wafer stage control system 31 and main controller 32 is not particularly limited as long as both the measurement light beams 6a and 6b strike the reflection mirror 7 and both the interferometers can undergo the predetermined recovery operation. However, since the interferometer switching operation may suffer from the following problem, it is not desirable to switch the interferometers during exposure or alignment.

As described above, in the recovery operation of the interferometer, an arithmetic operation is made based on the measurement value which is measured by the other interferometer and the θz measurement value. Since the arithmetic operation uses the measurement values of the two Y-interferometers in addition to that of the X-interferometer, observation noise components contained in these measurement values may deteriorate the position measurement precision of the wafer stage 1. Hence, the interferometer switching operation is preferably done as least frequently as possible. In this embodiment, an identical interferometer is used in a series of operations of each of exposure and alignment. For this reason, the interferometer switching operation is required only when the wafer stage 1 moves between the exposure region and alignment region (between processes 3 and 4, and among processes 4, 5, and 6). Hence, the number of times of switching of the interferometers can be minimized, and high-precision wafer stage position measurement can be implemented. Note that the interferometer switching timing is controlled by the main controller 32 on the basis of the Y-measurement value of the wafer stage, as described above.

In this embodiment, X-measurement has been exemplified. However, the present invention is not limited to such specific measurement, and may be applied to a case wherein the exposure optical axis and alignment optical axis have an offset along the X-axis, and an interferometer for Y-position measurement upon alignment is placed on the Y-axis.

As described above, according to the first embodiment, since different laser interferometers are used upon movement of the wafer stage within the exposure region (X-position measurement upon exposure), and within the alignment region (X-position measurement upon alignment), the length of the reflection mirror provided on the wafer stage can be shortened, thus attaining size and weight reductions of the stage.

In the first embodiment, the reflection mirror is provided on the wafer stage. However, the present invention is not limited to such a specific arrangement. For example, a mirror surface may be formed on the side surface of the stage top plate of the wafer stage, and may be used as a reflection mirror for laser interferometers. When the reflection mirror is formed on the side surface of the stage top plate, not only a weight reduction of the stage can be attained, but also the rigidity of the entire stage apparatus can be improved since the stage and the reflection mirror are integrated, and scattering of the atmosphere upon stage movement can be minimized since the stage surface becomes flat.

According to the first embodiment, since interferometer switching is inhibited during exposure and alignment, and an identical interferometer is used during exposure or alignment, the influence of deterioration of position measurement precision upon switching of the interferometers can be minimized.

According to the first embodiment, since the interferometer is switched to another while the wafer stage moves between the exposure and alignment regions, the number of times of switching of the interferometers can be reduced.

Second Embodiment

In the first embodiment, interferometer switching on the wafer stage has been exemplified. However, the present invention is not limited to the wafer stage.

FIG. 2 shows the second embodiment of the present invention, which is applied to a reticle stage in a scanning exposure apparatus.

A reticle board 12 is held on a reticle stage 11. The reticle stage 11 is guided by a static pressure bearing or static pressure guide mechanism to be movable in an X-Y plane, and is supported by a pressurization mechanism (not shown) that pressurizes using a magnetic attraction force, vacuum suction force, or the like to have high rigidity in the Z-direction. Also, the reticle stage 11 has linear motors (not shown) for driving the reticle stage 11 in the X-Y plane.

A first reticle Y-interferometer 151 for Y-measurement of the reticle stage 11 measures the position of the reticle stage 11 using reflected light of measurement light 15a, which strikes a Y-reflection mirror 17y from the Y-direction to pass through an exposure light optical axis center 13 and alignment optical axis center 14. Also, a second reticle Y-interferometer 152 for Y-position measurement of the reticle stage 11 cooperates with the first reticle Y-interferometer 151, and the θz position of the reticle stage can be measured based on the two Y-measurement results. A first reticle X-interferometer 161 for X-position measurement of the reticle stage 11 measures the X-position of the reticle stage 11 using reflected light of measurement light 16a, which strikes an X-reflection mirror 17x from the X-direction to pass through the exposure optical axis center 13. Furthermore, a second reticle X-interferometer 162 for X-position measurement of the reticle stage 11 upon alignment measurement measures the position of the reticle stage 11 using reflected light of measurement light 16b, which strikes the X-reflection mirror 17x from the X-direction to pass through the alignment optical axis center 14.

Upon setting the reticle board 12 on the reticle stage 11, the reticle board 12 must be aligned to the reticle stage 11 with high precision. Upon alignment of the reticle, a method of irradiating a predetermined mark on the reticle with alignment light, and obtaining any alignment error on the basis of the reflected light is used. This alignment mechanism is placed at a position where the alignment optical axis 14 is separated a predetermined distance from the exposure optical axis 13 in the Y-direction, due to structural limitations.

For this reason, the size of the X-reflection mirror 17x satisfies the following conditions.

Within the moving range-of the reticle stage 11 (to be referred to as an exposure region hereinafter) required upon exposure for transmitting exposure light through a predetermined position of the reticle board 12, an arbitrary X-position of the reticle stage 11 can be measured by the first reticle X-interferometer 161 and X-reflection mirror 17x. On the other hand, within the moving range of the reticle stage 11 (to be referred to as a reticle alignment region hereinafter) required for alignment for irradiating a predetermined alignment mark on the reticle board 12 with alignment light, an arbitrary X-position of the reticle stage 11 can be measured by the second reticle X-interferometer 162 for X-position measurement upon reticle alignment and X-reflection mirror 17x.

The spacing between a measurement optical axis 16a of the first reticle X-interferometer 161 and a measurement optical axis 16b of the second reticle X-interferometer 162 is smaller than the length of the X-reflection mirror 17x, and there is a region where both the measurement light beams simultaneously strike the X-reflection mirror 17x. Hence, the reticle position can be measured by either the first or second reticle X-position interferometer 161 or 162 over the entire moving range of the reticle stage 11 by switching the interferometers as in the aforementioned first embodiment. Note that the position of the reticle stage 11 upon exchanging the reticle board 12 is in the vicinity of the reticle alignment position.

In position measurement of the reticle stage 11 in this embodiment, upon reticle board exchange and reticle alignment, the second reticle X-interferometer 162 measures the X-position of the reticle stage. Upon exposure, the first reticle X-interferometer 161 is used. The interferometer used is switched while the reticle stage moves between the reticle alignment region and exposure region, and interferometer switching is inhibited during reticle alignment and exposure.

As described above, according to the second embodiment, since different laser interferometers are used depending on the positions of the reticle stage (i.e., the exposure region or alignment region), the length of the reflection mirror provided to the reticle stage can be shortened, thus achieving size and weight reductions of the stage.

Also, according to the second embodiment, since interferometer switching is inhibited during exposure and alignment, and an identical interferometer is used, the influence of deterioration of position measurement precision due to interferometer switching can be minimized.

Furthermore, according to the second embodiment, since the interferometer is switched to another while the reticle stage moves between the exposure region and alignment region, the number of times of switching of the interferometers can be reduced.

Third Embodiment

In the above embodiments, interferometers are used as means for measuring the stage position, and their switching process has been explained. However, the position detection means are not limited to interferometers.

Figure 5:
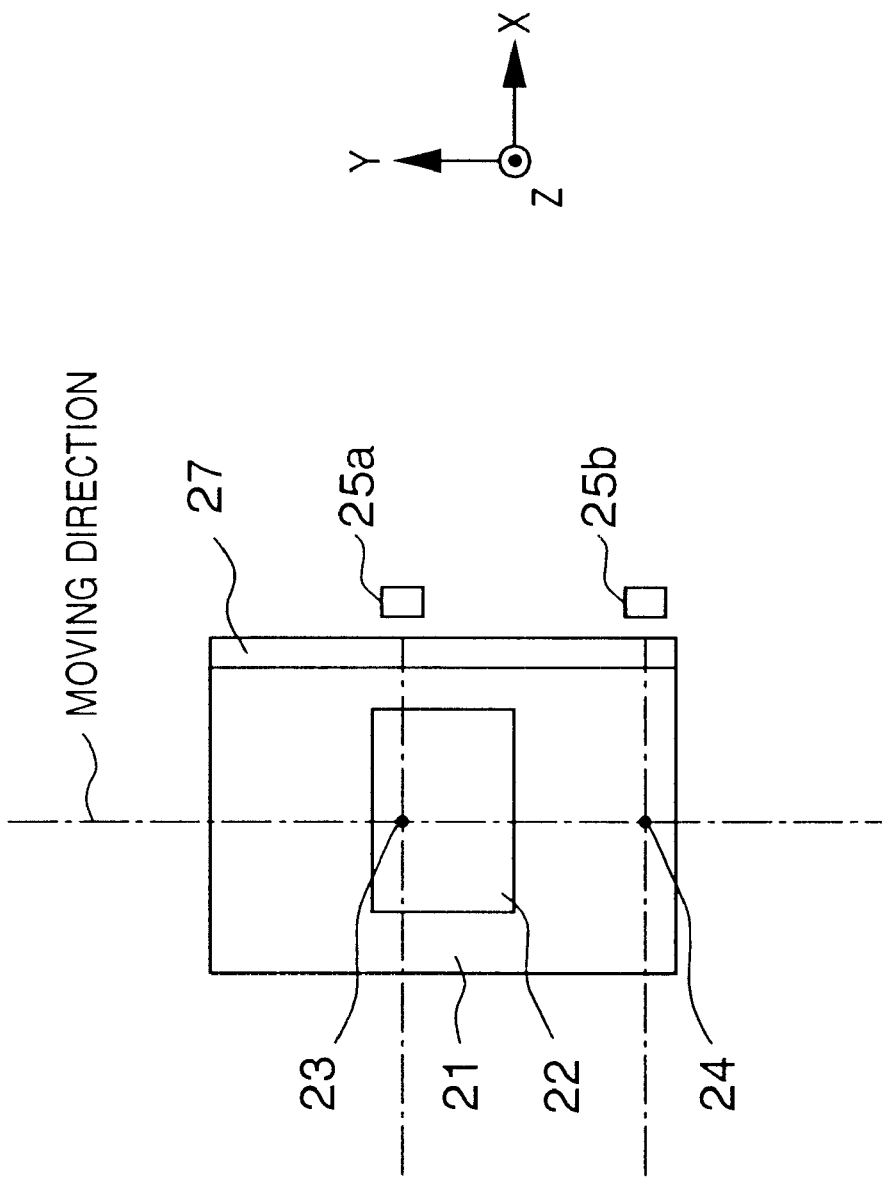
FIG. 5 is a schematic top view of a reticle stage according to the third embodiment of the present invention.

FIG. 5 is a schematic top view of a reticle stage according to the third embodiment of the present invention. In this embodiment, a linear encoder is used to measure the Y-position of a reticle stage.

A reticle stage 21 that carries a reticle board 22 is movable in the Y-direction.

A first reticle Y-reader 25a reads a linear scale 27 provided to the reticle stage 21, and measures the Y-position of the reticle stage 21. The first reticle Y-reader 25a is located at nearly the same Y-coordinate position as that of an exposure optical axis center 23. A second reticle Y-reader 25b similarly reads the linear scale 27 and measures the Y-position of the reticle stage 21. The second reticle Y-reader 25b is located at nearly the same Y-coordinate position as that of an alignment optical axis center 24.

Upon mounting the reticle board 22 on the reticle stage 21, the reticle board 22 must be aligned to the reticle stage 21 with high precision. Upon alignment of the reticle, a method of irradiating a predetermined mark on the reticle with alignment light, and obtaining any alignment error amount from the reflected light is used. This alignment mechanism is located at a position where the alignment optical axis 24 is separated a predetermined distance from the exposure optical axis 23 of an exposure optical system in the Y-direction due to structural limitations.

For this reason, the linear scale 27 satisfies the following conditions.

Within the moving range of the reticle stage 21 (to be referred to as an exposure region hereinafter) required in exposure for transmitting exposure light through a predetermined position of the reticle board 22, an arbitrary Y-position of the reticle stage can be measured by the first reticle Y-reader 25a and linear scale 27. Also, within the moving range of the reticle stage 21 (to be referred to as a reticle alignment region hereinafter) required in alignment for irradiating a predetermined alignment mark of the reticle board 22 with alignment light, an arbitrary Y-position of the reticle stage can be measured by the second reticle Y-reader-25b for Y-position measurement upon reticle alignment and the linear scale 27.

The spacing between the measurement positions of the first and second reticle Y-readers 25a and 25b is smaller than the length of the linear scale, and there is a region where both the readers can simultaneously read the linear scale. Hence, when the reader is switched to another like switching of the X-interferometers in the aforementioned embodiment, the Y-position of the reticle can be measured over the entire moving range of the reticle stage 21 using either the first or second reticle Y-reader 25a or 25b. The position of the reticle stage 21 upon exchanging the reticle board 22 is in the vicinity of the reticle alignment position.

In position measurement of the reticle stage 21 of this embodiment, upon reticle board exchange and reticle alignment, the Y-position of the reticle stage is measured using the second reticle Y-reader 25b for Y-position measurement upon reticle alignment. Upon exposure, the first reticle Y-reader 25a is used. The reader to be used is switched while the reticle stage 21 moves between the reticle alignment region and exposure region, and reader switching is inhibited during reticle alignment and exposure.

According to this embodiment, since different readers are used depending on the positions of the reticle stage (i.e., the exposure region or alignment region), the length of the linear scale for an encoder provided to the reticle stage can be shortened, thus achieving size and weight reductions of the stage.

Also, according to this embodiment, since reader switching is inhibited during exposure and alignment, and an identical reader is used, the influence of deterioration of position measurement precision due to reader switching can be minimized.

Furthermore, according to this embodiment, since the reader is switched to another while the reticle stage moves between the exposure region and alignment region, the number of times of switching of the readers can be reduced.

Note that the encoder used in this embodiment may be either an optical or magnetic one.

As described above, according to the first to third embodiments, the following merits are expected.

That is, the size of a measurement assist device can be reduced, and size and weight reductions of the stage can be achieved.

Also, the number of times of switching of a measurement device can be reduced.

Since the measurement device is inhibited from being switched during exposure and alignment, and the stage position is measured using an identical measurement device, high-precision exposure and alignment can be achieved.

Upon switching the measurement device to another, the initial measurement value of the measurement device to be used after switching can be calculated.

A high throughput can be achieved by size and weight reductions of the stage.

The number of times of switching of the interferometers can be reduced, and the stage position can be measured with high precision.

Fourth Embodiment

In each of the above embodiments, a plurality of laser interferometers (first and second X-interferometers) for measuring the stage position in a second axis direction (X-direction) perpendicular to a first axis direction (Y-direction) that requires a relatively large stage moving distance are provided to reduce the length of the reflection mirror, thus achieving size and weight reductions of the stage that carries the reflection mirror. The first or second X-interferometer to be used is switched to another at a predetermined position. As described above, interferometer switching includes a measurement error factor. In the fourth embodiment, the switching position is varied depending on the moving direction (+ or − direction) in the first axis direction. In this manner, hysteresis characteristics can be provided to the switching position, and chattering that switches the measurement value frequently can be prevented, thus measuring the stage position with high precision.

Figure 6:
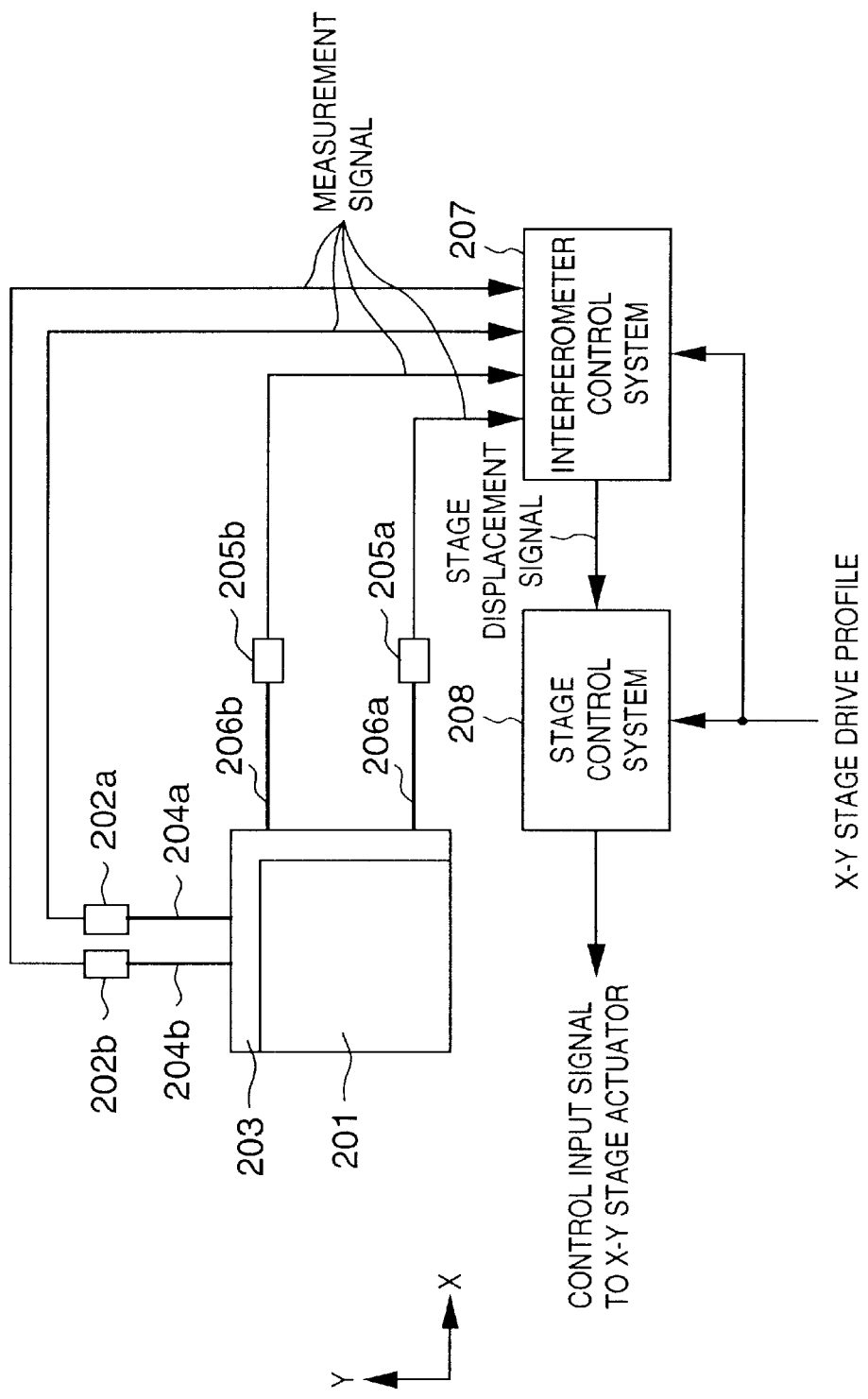
FIG. 6 is a top view of an X-Y stage according to the fourth embodiment of the present invention.

FIG. 6 shows the arrangement of an alignment stage apparatus according to the fourth embodiment. Referring to FIG. 6, an X-Y stage 201 is supported on a surface plate (not shown) to be movable in the X-Y plane using a guide mechanism (not shown). The X-Y stage 201 is driven in the X- and Y-directions and rotation direction (θ) in the plane by actuators (not shown). A first Y-interferometer 202a for measuring the Y-position of the X-Y stage 201 is integrated with a lens barrel surface plate (not shown) that supports a projection optical system (not shown), and is used in combination with a reflection mirror 203 provided on the X-Y stage 201. A second Y-interferometer 202b is integrated with the lens barrel surface plate (not shown) to be separated a predetermined distance from the first Y-interferometer 202a, and to have an optical axis 204b parallel to a measurement optical axis 204a of the first Y-interferometer 202a. Any θ-displacement is calculated from the difference between the position measurement values of the first and second Y-interferometers 202a and 202b, and the spacing between their measurement optical axes 204a and 204b. In order to measure any X-displacement of the X-Y stage 201, first and second X-interferometers 205a and 205b are integrated with the lens barrel surface plate (not shown). Reference numerals 206a and 206b denote measurement optical axes of the first and second X-interferometers 205a and 205b.

An interferometer control system 207 outputs a stage displacement signal used in a stage control system 208. More specifically, the interferometer control system 207 calculates and outputs the Y- and θ-displacements, and outputs an X-stage displacement used in control arithmetic operations based on outputs from the two X-interferometers 205a and 205b. Also, the interferometer control system 207 controls initialization and recovery operations of all the interferometers. The stage control system 208 controls alignment of the X-Y stage on the basis of the stage displacement signals output from the interferometer control system 207 and a stage drive profile output from a main body controller (not shown), and outputs control commands to the actuators.

Figure 7:
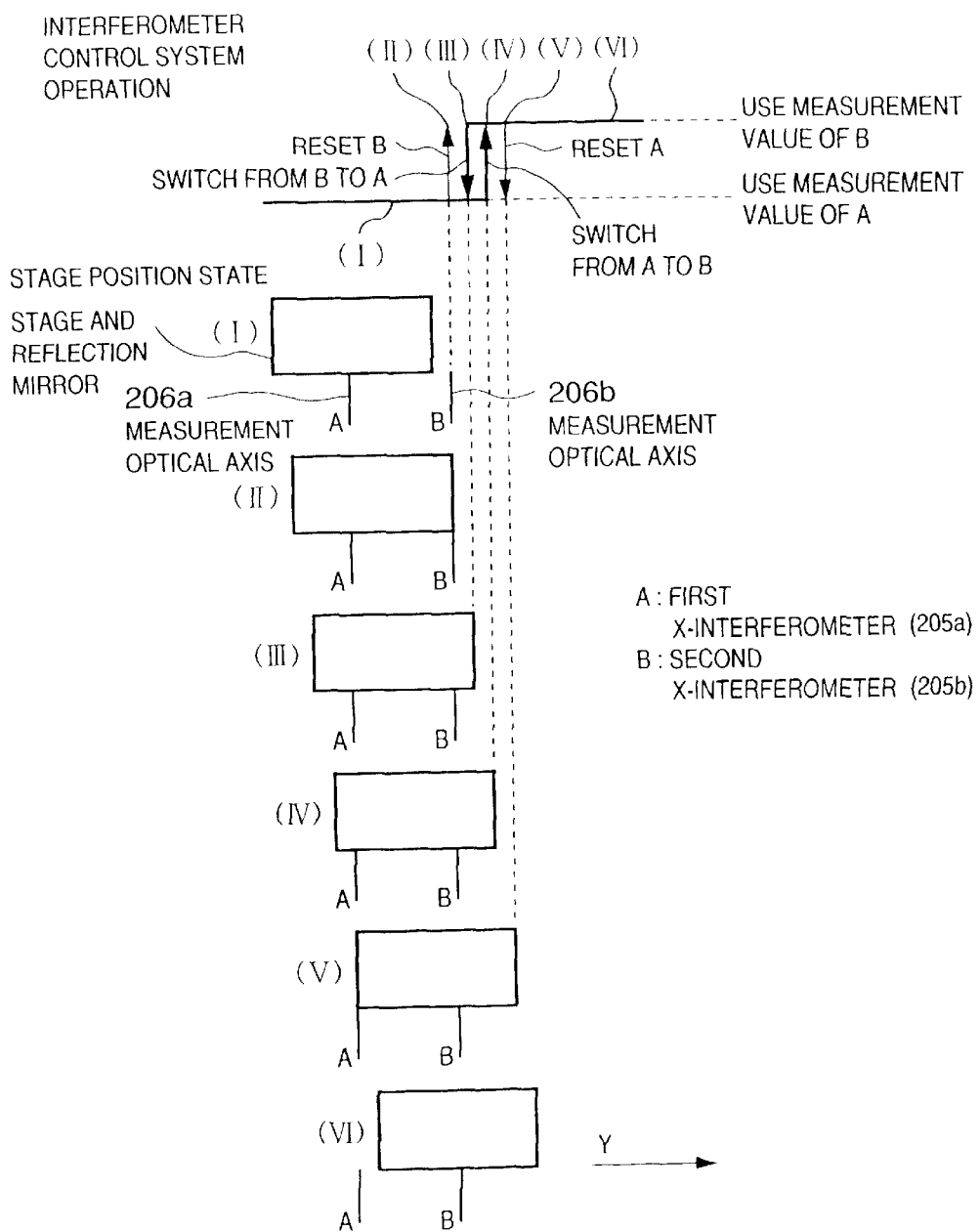
FIG. 7 is a view showing the relationship-between the interferometer switching operation and stage position in the fourth embodiment.

The switching operation between the first and second X-interferometers 205a and 205b for measuring an X-displacement will be explained below using FIG. 7. Referring to FIG. 7, A represents the first X-interferometer 205a and its measurement optical axis, and B, the second X-interferometer 205b and its measurement optical axis. A lateral direction traverses the plane of paper plots a Y-displacement, and (I) to (VI) represent states between the measurement optical axes 206a and 206b of the X-interferometers 205a and 205b, and the stage position.

Assume that the X-Y stage 201 is in state (I). At this time, the measurement optical axis of B deviates from the reflection mirror, and B is not ready to measure. On the other hand, A is ready to measure, and the X-displacement of the X-Y stage 201 is measured using the measurement value of A.

Assume that the X-Y stage has moved in the +Y-direction (right direction of the plane of paper) and has reached state (II). For example, the position of state (II) is set when the measurement optical axis of B strikes the reflection mirror, and B is ready to measure the X-displacement of the X-Y stage 201. Since an interferometer measures relative movement of an object to be measured on the basis of a certain initial value of a counter of an interferometer measurement system, once its measurement light departs from the reflection mirror, it becomes impossible to measure the position of the object to be measured. Hence, when the measurement light of that interferometer strikes the reflection mirror, recovery (reset) operation must be done. For example, an error clear process and the like in the interferometer measurement system are done, but a detailed description thereof will be omitted here, and only the counter is reset to zero in FIG. 7. Note that the value of A may be given to B as an initial value in place of resetting the counter to zero. In FIG. 7, the upward arrow of the interferometer control system operation in state (II) indicates that this operation is done only when the stage moves from (I) to (II). Hence, even when the X-Y stage moves from (III) to (II), B is not reset. At this time, both A and B are ready to measure the X-displacement of the X-Y stage 201, but the stage control system controls the stage using the measurement value of A.

Assume that the X-Y stage has further moved in the +Y-direction, and has reached state (IV) via (III). At this time, the measurement value of the X-displacement used in control of the X-Y stage is switched from the measurement value of A to that of B. The value passing method upon switching will be explained in detail later. In FIG. 7, the upward arrow of the interferometer control system operation in state (IV) indicates that this operation is done only when the stage moves from (III) to (IV), but is not done upon movement from (V) to (IV). When the X-Y stage has further moved in the +Y-direction and has passed state (V), the measurement optical axis of A drifts from the reflection mirror, and A is disabled to measure. To summarize the operations so far, when the X-Y stage moves from (I) to (VI), the measurement value of A is used as an X-displacement from (I) to (IV); that of B is used as an X-displacement from (IV) to (VI).

The same operations are done when the X-Y stage moves from (VI) to (I) in the -Y-direction. That is, when the X-Y stage has reached state (V), A is reset. The downward arrow of the interferometer control system operation in (V) in FIG. 7 indicates that this operation is done when the stage moves from (VI) to (V). At this time, both A and B are ready to measure the X-displacement of the X-Y stage 201, but the stage control system controls the stage using the measurement value of B.

When the X-Y stage has further moved in the -Y-direction and has reached state (III), the measurement value of B is switched to that of A upon measuring the X-displacement. The downward arrow of the interferometer control system operation in (III) in FIG. 7 indicates that this operation is done when the stage moves from (IV) to (III). Hence, when the X-Y stage moves from (VI) to (I), the measurement value of B is used as an X-displacement from (VI) to (III); that of A is used as an X-displacement from (III) to (I).

The spacing between positions (III) and (IV) is preferably set as follows. When the measurement value is passed between the two interferometers (to be described in detail later), some error is superposed on the passed value. When the measurement value is passed a large number of times, the accumulated errors lower the reliability of the measurement value and adversely influence the final exposure precision. Hence, the number of times of passing is preferably as small as possible. A case will be examined wherein the X-Y stage is aligned to stop between (III) and (IV). In this case, due to certain servo error resulting from disturbance to the X-Y stage, observation noise in the measurement system, and the like, vibration components of these errors are superposed on the measurement value of the interferometer to have an alignment command position as the center. If both the positions (III) and (IV) fall within this vibration range, chattering unwantedly occurs; passing takes place a large number of times within a very short period of time. Hence, the spacing between positions (III) and (IV) is set so that at least one of them deviates from this vibration region.

Figure 8:
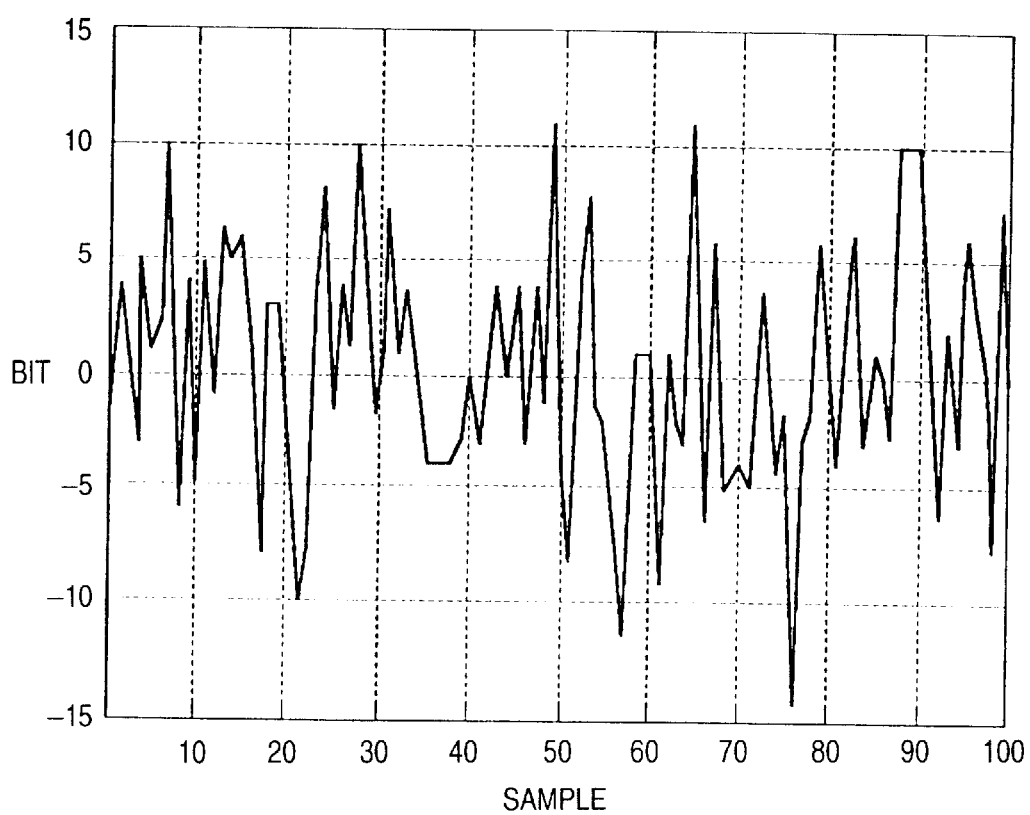
FIG. 8 is a graph showing an example of the interferometer measurement value in the apparatus shown in FIG. 6.

The method of passing the measurement value between the interferometers will be explained below. A simple case will be explained first. That is, assume that the stage moves in only the Y direction, the θ-displacement is always zero, and the reflection mirror is truly flat. In this case, the measurement value of the first X-interferometer can be passed to the second X-interferometer or vice versa. However, even when the stage stands still in the X-direction, as described above, the difference value between the two interferometers has oscillation error components in practice in a signal having a central value=0 bit, as shown in FIG. 8 (1 bit is the measurement resolution of the interferometer). In case of FIG. 8, if only one sample value is used, the measurement value may be passed to have an error of 10 bits or more (for example, when the 76th sample is passed, an error of 14 bits is produced).

To avoid such a situation, the interferometer control system executes the following process. Assume that the measurement value is passed at a sample time 100. At this time, an average value is calculated using a plurality of sample values before the sample time 100. For example, the average value of values from a sample time 91 to sample time 100 is -1, and the value to be passed can be obtained with sufficiently high precision in practice. The method of calculating the average is the simplest one. In addition, a smoothing process may be done using various types of filters used in general data processes to remove noise components from the difference value. That is, in this embodiment, the reliability of the value to be passed is improved using a plurality of sample values before passing, thus reducing errors.

Assume that the value is passed from the first X-interferometer 205a which is measuring the stage position from the origin of the stage to the second X-interferometer 205b that has undergone the recovery operation. The first X-interferometer 205a measures the X-displacement of the stage, while the second X-interferometer 205b resets its counter to zero in the recovery operation. Hence, the measurement values of these two interferometers have a difference corresponding to the X-displacement. The interferometer control system 207 outputs, as an X-interferometer position signal, a value obtained by adding a difference value α that has been smoothed, as described above, as an offset, to the measurement value of the second X-interferometer 205b.

Figure 9:
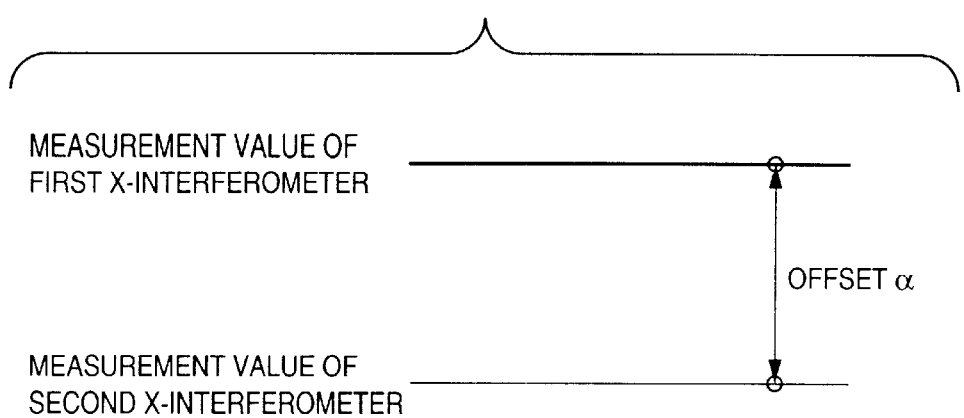
FIG. 9 is a view showing the principle of measurement value passing in the apparatus shown in FIG. 6.

FIG. 9 shows the concept of passing of the difference value α. Note that the same applies to a case wherein the stage moves in the Y-direction, the first X-interferometer 205a temporarily drifts from the measurement region, returns to the measurement region again, undergoes the recovery operation, and the measurement value is passed from the second X-interferometer 205b to the first X-interferometer 205a. In this case, the interferometer control system 207 sets an offset β by smoothing the difference value between the measurement value (including the offset α) of the second X-interferometer 205b and that of the first X-interferometer 205a, and outputs, as an X-measurement value, a value obtained by adding β to the measurement value of the first X-interferometer 205a. The same operation is done every time the interferometer is switched to another.

Figure 10:
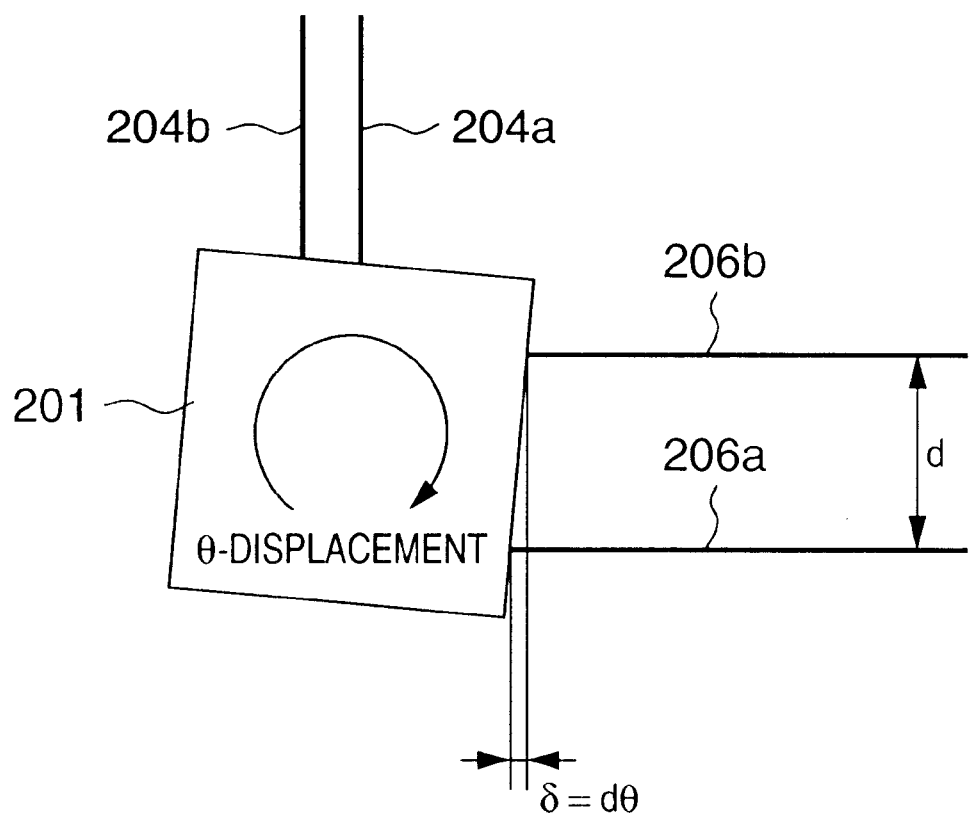
FIG. 10 is a view showing the principle of any X-displacement error due to a θ-displacement in the apparatus shown in FIG. 6.

A case will be examined below wherein the X-Y stage has suffered a θ-displacement. As shown in FIG. 10, since the optical axis 206a of the first X-interferometer is separated by a distance d from the optical axis 206b of the second X-interferometer, their X-measurement values have a difference δ=dθ due to the θ-displacement. Hence, upon calculating the aforementioned offsets α and β, correction using the value δ is required.

Figure 11:
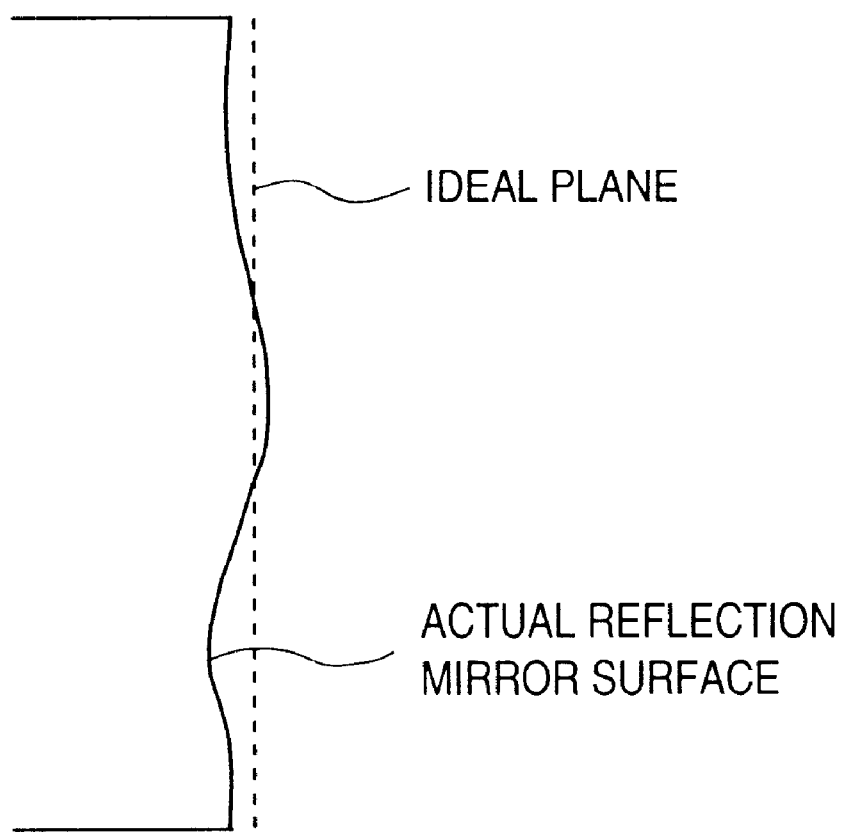
FIG. 11 is a view showing the principle of geometric error of a reflection mirror in the apparatus shown in FIG. 6.

Also, the reflection mirror 203 does not have a perfect flat plane, but suffers geometric shape errors (FIG. 11). Hence, correction is made using separately calculated functions f1(y) and f2(y) of the reflection mirror deformation values. As the functions f1 and f2, Y-stage positions y of the first and second X-interferometers 205a and 205b are used as arguments, and the displacement of the reflection mirror from an ideal plane is output. Likewise, for the first and second Y-interferometers, geometric errors of the reflection mirror are corrected using correction functions fy1(x) and fy2(x).

Figure 12:
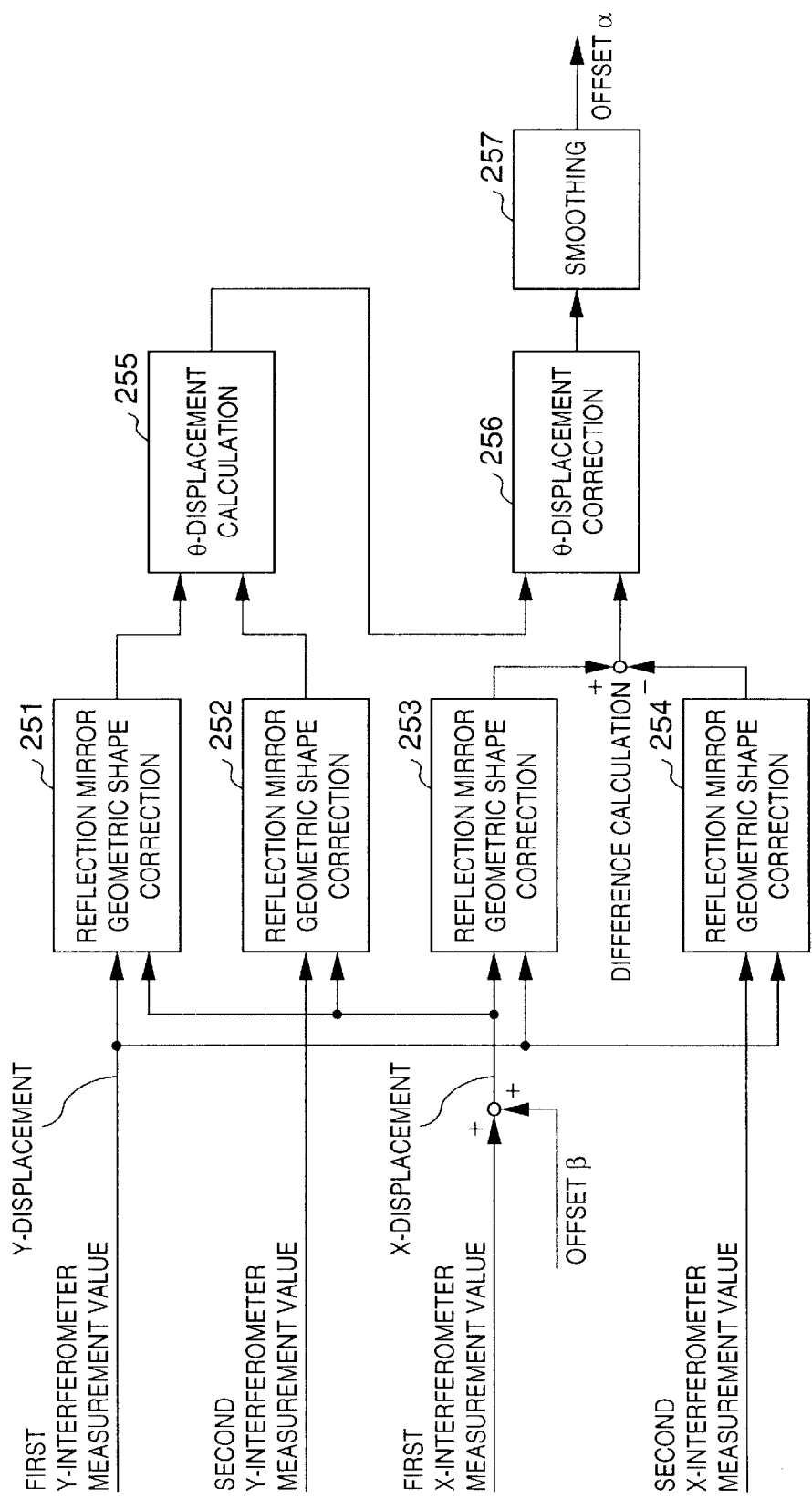
FIG. 12 is a diagram showing the measurement value passing operation in the fourth embodiment.

FIG. 12 shows calculation operation of an offset value upon passing when all the aforementioned correction processes are used. FIG. 12 exemplifies a calculation method of the offset α to be passed from the first X-interferometer 205a to the second X-interferometer 205b. The X-displacement is the sum of the value of the first X-interferometer 205a and the offset β. Reflection mirror geometric shape correction processes 251 to 254 correct geometric errors of the reflection mirror 203 by the aforementioned correction functions using X- and Y-displacements. A θ-displacement calculation process 255 calculates the θ-displacement of the X-Y stage from the measurement values (that have been corrected by the processes 251 and 252) of the first and second Y-interferometers 202a and 202b, and the spacing of their optical axes. A θ-displacement correction process 256 corrects the difference between the measurement values of the first and second X-interferometers 205a and 205b using this θ-displacement and the spacing d between the optical axes of the first and second X-interferometers 205a and 205b to obtain a corrected difference value. A smoothing process 257 smoothes that difference value to obtain the offset value α. Upon switching the second X-interferometer 205b to the first X-interferometer 205a, the offset value β is calculated in the same procedure.

In the fourth embodiment, two interferometers are used to measure the X-displacement of the stage. However, the present invention is not limited to this, but three or more interferometers may be used. In this case, the spacing between the optical axes of neighboring interferometers is smaller than the length of the reflection mirror.

As described above, according to the fourth embodiment, the size of the reflection mirror can be reduced, size and weight reductions of the stage can be attained, and chattering can be prevented, thus realizing high-precision stage position measurement.

Fifth Embodiment

Figure 13:
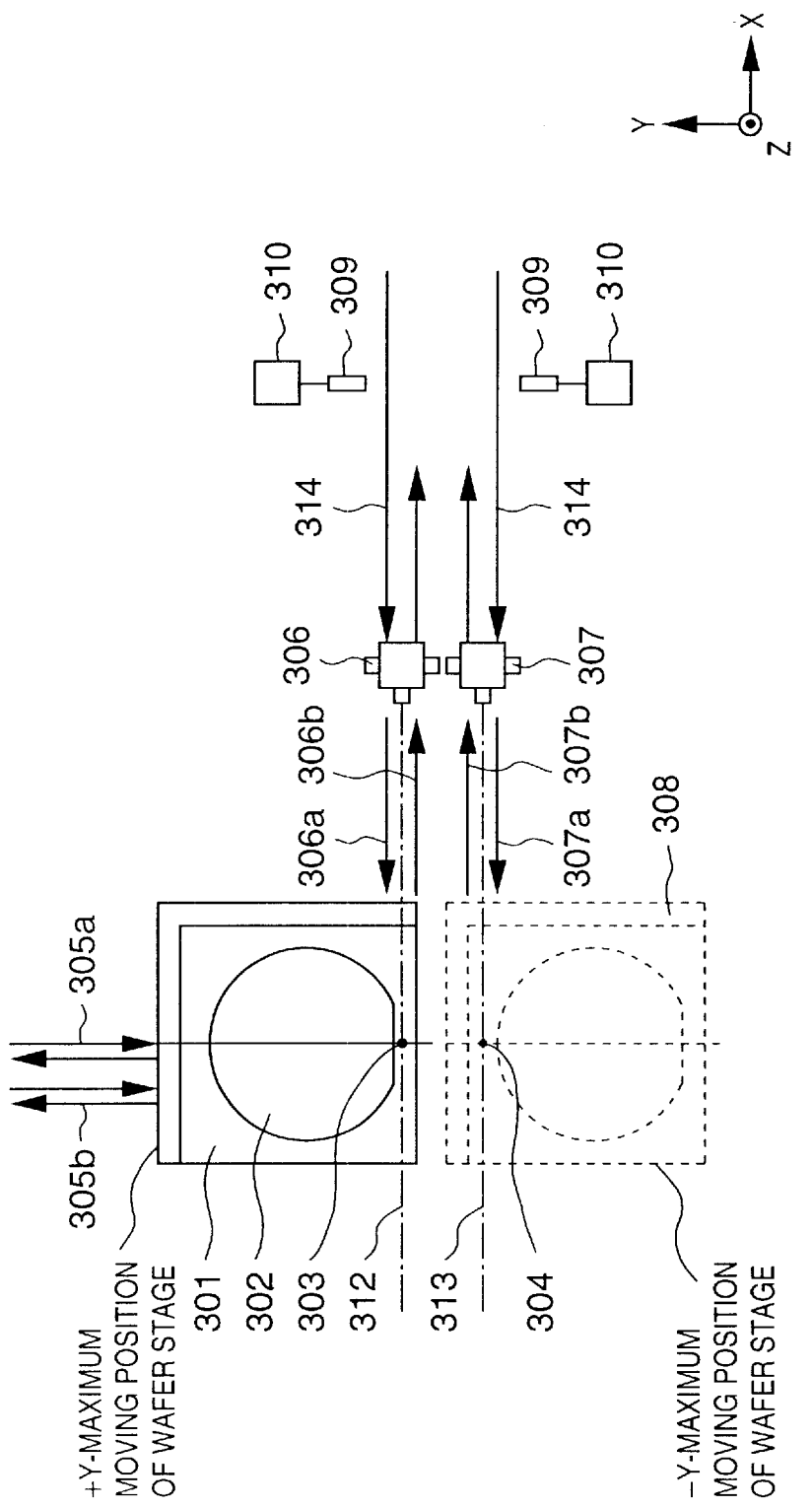
FIG. 13 is a schematic top view of a wafer stage of an exposure apparatus according to the fifth embodiment of the present invention.

FIG. 13 is a schematic top view of a wafer stage of an exposure apparatus according to the fifth embodiment of the present invention. This exposure apparatus comprises a projection optical system for exposing a reticle pattern at each exposure position on a wafer 302, which is aligned in turn, a wafer stage 301 for controlling the position of the wafer 302, an alignment optical system (not shown) for performing alignment measurement for the wafer 302, and position measurement means for irradiating a reflection mirror 308, which is fixed on the wafer stage 301 and extends in the X- and Y-directions, with a laser beam, and measuring the X- and Y-positions of the wafer stage 301. The position measurement means has an exposure X-measurement interferometer 306 used to align the wafer 302 to an exposure optical axis 303, and an alignment X-measurement interferometer 307 used to align the wafer 302 to a measurement optical axis 304 of the alignment optical system.

The wafer 302 is mounted on the wafer stage 301 via a wafer chuck (not shown). The wafer stage 301 is supported by a surface plate (not shown) to be movable in the X-, Y-, and Z-directions, and rotation directions about the respective axes, and comprises linear motors (not shown) as actuators for driving the wafer stage 301 in these moving directions. The alignment optical system is constructed in the neighborhood of the projection optical system. The alignment optical system uses alignment light having a wavelength different from that of exposure light. An alignment optical axis center 304 does not match an exposure optical axis center 303, and is located at a position separated therefrom in the Y-direction.

The exposure apparatus also comprises a first Y-interferometer and first Y-receiver (neither are shown) which are used to measure the Y-position of the wafer stage 301, and measure reflected light of first Y-interferometer measurement light 305a, that strikes the reflection mirror 308 from the Y direction to pass through the exposure optical axis 303 and alignment optical axis 304. An exposure X-interferometer 306 and X-receiver (not shown), which are used to measure the X-position of the wafer stage 301 upon wafer exposure measure the stage position using reflected light 306b of exposure X-measurement light 306a, which strikes the reflection mirror 308 from the X-direction to pass through the exposure optical axis center 303. An alignment X-measurement interferometer 307 and alignment X-receiver (not shown) for X-measurement upon alignment measure the stage position using reflection light 307b of alignment X-interferometer measurement light 307a, which strikes the reflection mirror 308 from the X-direction to pass through the alignment optical axis center 304 Also, a second Y-interferometer (not shown) for measuring a rotation position θz about the Z-axis in cooperation with the first Y-interferometer is provided. The second Y-interferometer measures reflected light of second Y-interferometer measurement light 305b, which strikes the reflection mirror 308 from the Y-direction to be parallel to the first Y-interferometer measurement light 305a. Furthermore, three laser interferometers (not shown) for measuring the Z-position, rotation position θx about the X-axis, and rotation position θy about the Y-axis of the wafer stage 301 are provided. Note that the positions Z, θx, and θy of the wafer stage 301 may be measured by optical or magnetic linear scales in place of the laser interferometers.

The wafer stage 301 is aligned with high precision by a wafer stage control system (not shown) on the basis of the position measurement values of the wafer stage 301 and position target value commands to the wafer stage 301.

The positions of the exposure X-measurement interferometer 306 and alignment X-measurement interferometer 307 for X-position measurement, and the size of the reflection mirror 308 placed on the wafer stage 301 have the following relationship. The wafer stage 301 is required to have a moving range broad enough to expose the entire surface of the wafer 302. For this purpose, the reflection mirror 308 on the wafer stage 301 has a length large enough to allow the exposure X-measurement interferometer 306 to measure the X-position of the wafer stage 1 at an arbitrary wafer stage position upon wafer measurement. Likewise, the wafer stage 301 is required to have a moving range broad enough to perform alignment measurement of the entire surface of the wafer upon alignment measurement. For this purpose, the reflection mirror 308 on the wafer stage 301 has a length large enough to allow the alignment X-measurement interferometer 307 for X-position measurement upon alignment to measure the X-position of the wafer stage 301 at an arbitrary wafer stage position upon alignment measurement.

Conventionally, a single laser interferometer for X-measurement measures the position of the wafer stage 1 in the X-direction both upon wafer exposure and alignment measurement. However, the reflection mirror 308 provided on the wafer stage 301 is preferably as small as possible. In this embodiment, at least two interferometers for X-measurement of the wafer stage 301 are provided, and the reflection mirror 308 on the wafer stage 301 is irradiated with light from at least one of these interferometers.

In this case, in the wafer stage moving region upon exposure (to be referred to as a "moving region upon exposures" hereinafter), the alignment X-measurement light 307a deviates from the reflection mirror 308. On the other hand, in the wafer stage moving region upon alignment measurement (to be referred to as a "moving region upon alignment" hereinafter), the exposure X-measurement light 306a deviates from the reflection mirror 308. Since a laser interferometer cannot measure position as an absolute value, once the measurement optical axis of the interferometer deviates from the reflection mirror, the origin (zero point) must be redetected using another sensor or physical abutment.

However, in this embodiment, since the length of the reflection mirror 308 is larger than the spacing between the exposure X-measurement light 306a and alignment X-measurement light 307a, either measurement light strikes the reflection mirror 308 all the time, and both the measurements are never disabled at the same time. Hence, even when either the measurement optical axis deviates from the reflection mirror 308 and is impossible to measure, when the wafer stage 301 has moved to a position where the reflection mirror 308 is irradiated with that measurement light again, the interferometer measurement value can be re-set based on the measurement value of the other interferometer and the θz measurement value.

The distance measurement precision of a laser interferometer is influenced by changes in temperature, pressure, and the like of a medium. When the medium is air at ordinary temperature and pressure, the distance measurement precision is around 1 ppm/° C. However, in this embodiment, since the distances between the exposure X-measurement interferometer 306 and alignment X-measurement interferometer 307, and the reflection mirror 308 are set to be nearly equal to each other, the distance measurement precision of each interferometer is equivalently influenced by the temperature, and setting errors upon re-setting the interferometer measurement value can be minimized.

When a laser beam departs from the reflection mirror 308, it may strike structural members of the exposure apparatus, and may inadvertently emerge outside the exposure apparatus and may impair the distance measurement precision of another measurement system. Hence, in the fifth embodiment, in order to intercept the laser beam departing from the reflection mirror 308, light-shielding plates 309 and drive devices 310 for driving these light-shielding plates 309 are provided, and the laser beam can be intercepted before it departs from the reflection mirror 308. Each light-shielding plate 309 consists of a material having high absorbency with respect to the wavelength of the laser beam or has a specific surface coat to prevent reflection.

Figure 14:
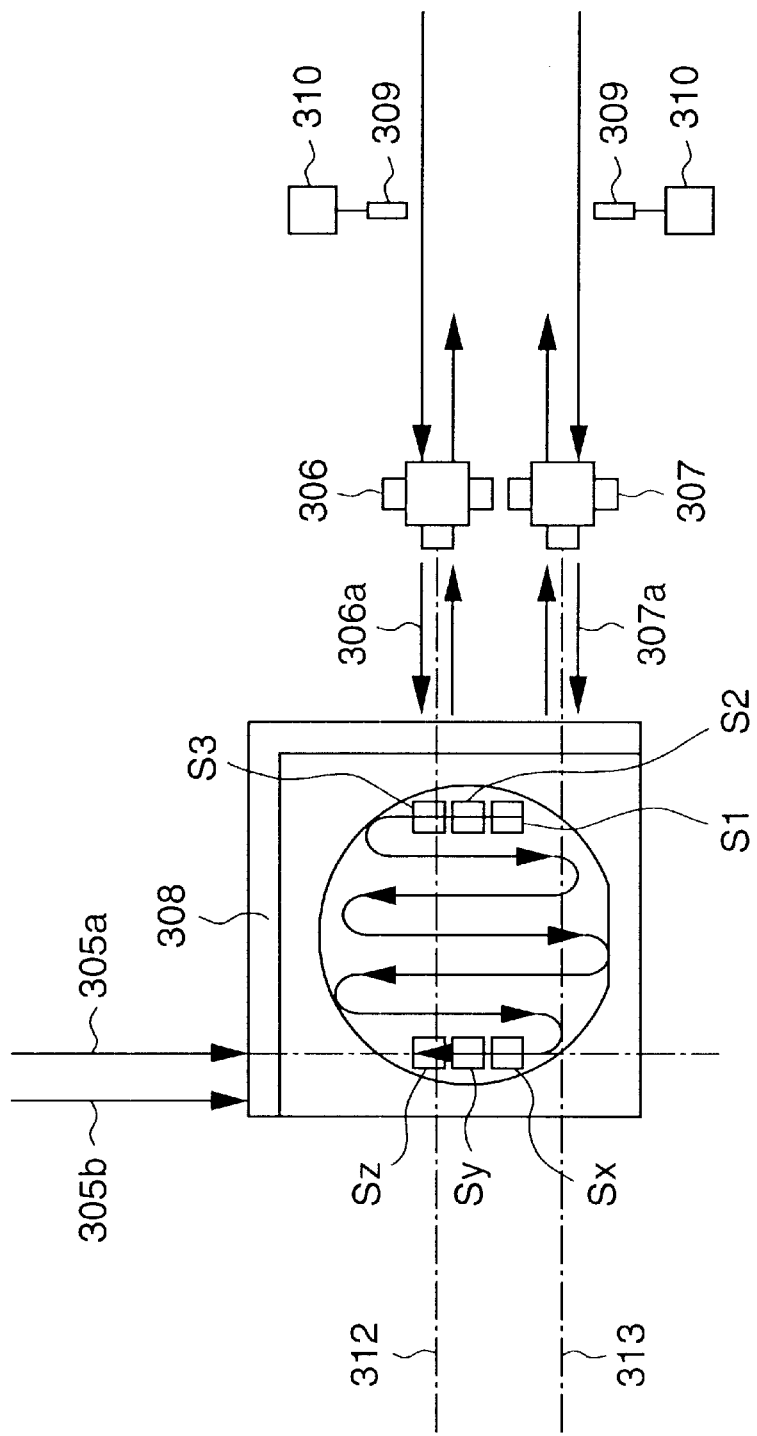
FIG. 14 is a view showing movement of the wafer stage upon exposure in the apparatus shown in FIG. 13.

Stage movement upon exposure in the exposure apparatus of this embodiment will be explained below using FIGS. 14 to 17. As shown in FIG. 14, stage movement is done in the exposure order of exposure positions S1, S2, S3, . . . , Sx, Sy, and Sz, and after that, the distance measurement value of the exposure X-measurement interferometer 306 is passed to that of the alignment X-measurement interferometer 307 to re-set the alignment X-measurement interferometer 307. With this movement, since the exposure position Sz where the distances between the exposure X-measurement interferometer 306 and alignment X-measurement interferometer 307, and the reflection mirror 308 are shortest is exposed last, the interferometer measurement value can be re-set with high precision. Furthermore, since the stage need not move to a position where the distances between the exposure X-measurement interferometer 306 and alignment X-measurement interferometer 307, and the reflection mirror 308 are shortest after exposure, alignment measurement can be started quickly.

Figure 16:
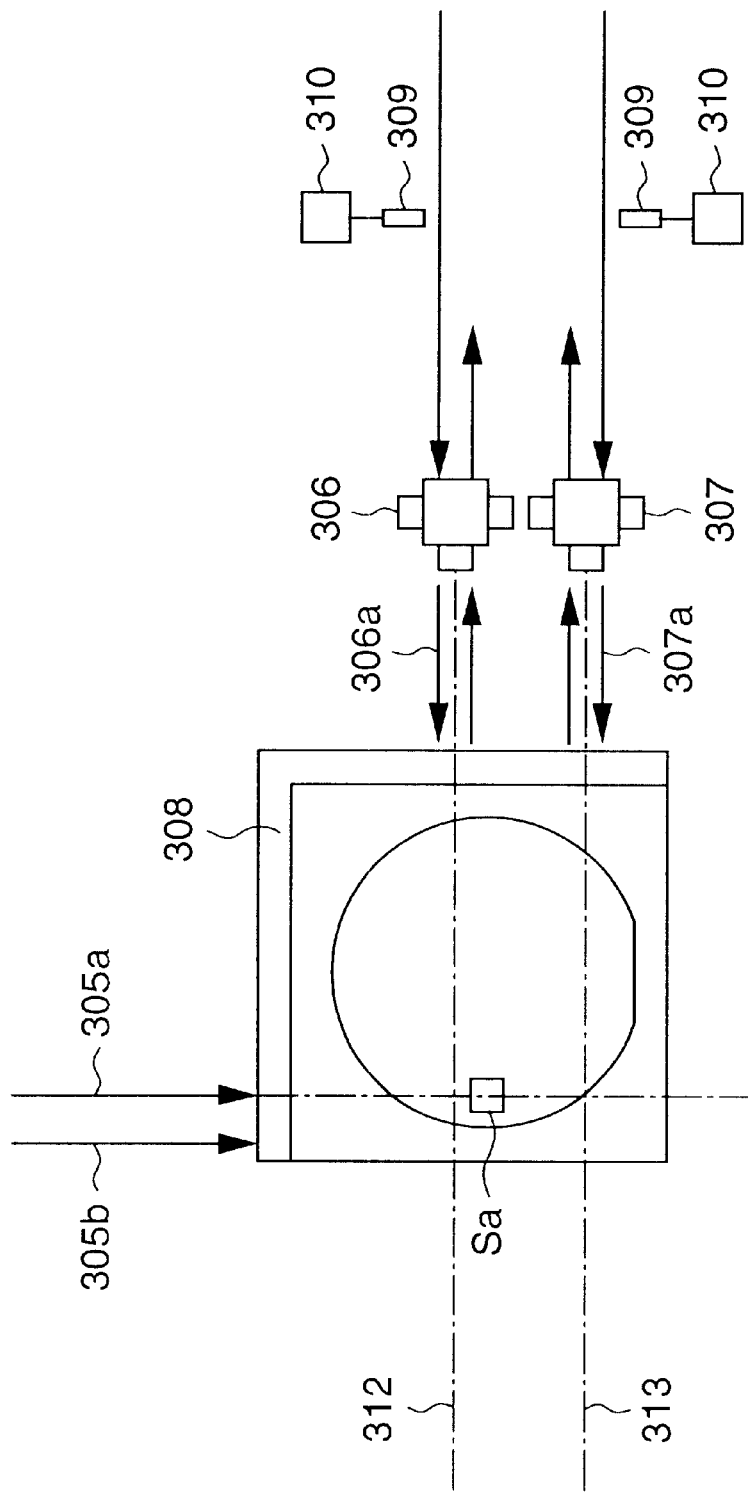
FIG. 16 is a view showing another example of movement of the wafer stage upon exposure in the apparatus shown in FIG. 13.
Figure 17:
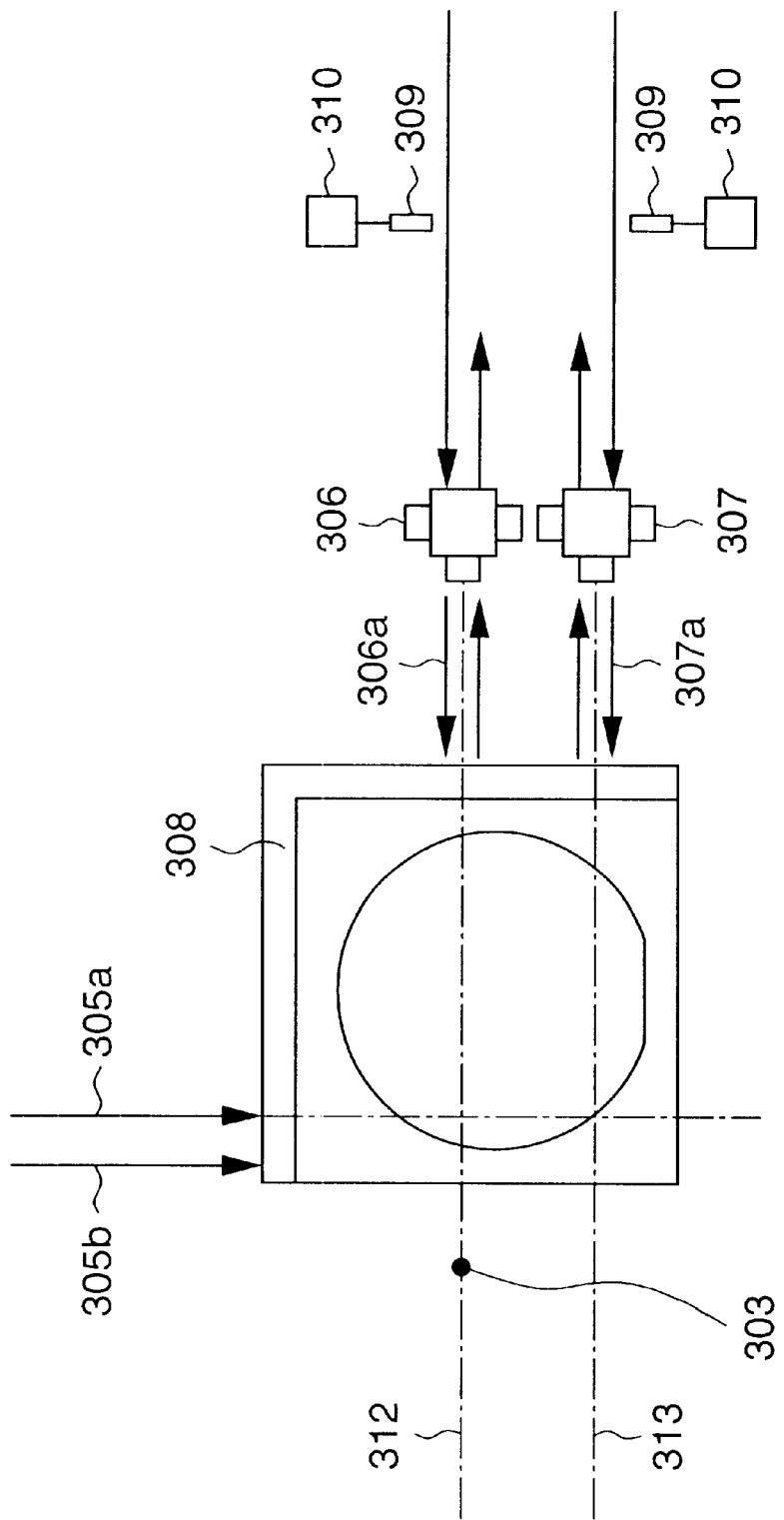
FIG. 17 is a view showing still another example of movement of the wafer stage upon exposure in the apparatus shown in FIG. 13.

On the other hand, the distance measurement value may be passed between the exposure X-measurement interferometer 306 and alignment X-measurement interferometer 307 at an exposure position Sa where the distances between the exposure X-measurement interferometer 306 and alignment X-measurement interferometer 307, and the reflection mirror 308 are shortest within the range in which the exposure region (exposure field of the exposure optical system) is located on the wafer, as shown in FIG. 16. Alternatively, the distance measurement value may be passed when the exposure optical axis deviates from the wafer, as shown in FIG. 17. In this manner, the distance measurement value can be passed between the exposure X-measurement interferometer 306 and alignment X-measurement interferometer 307 with higher precision.

Figure 15:
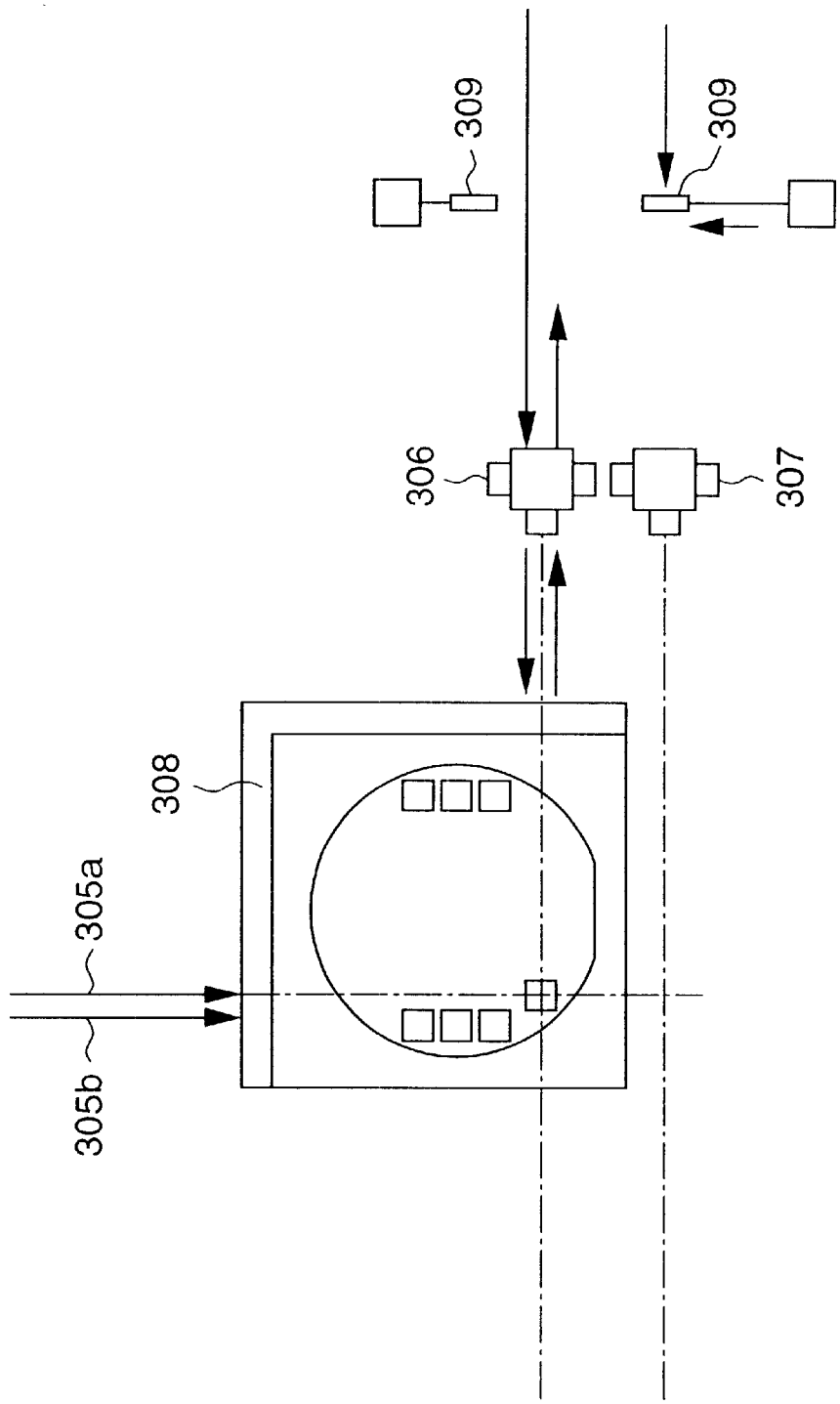
FIG. 15 is a view showing laser beam interception in the apparatus shown in FIG. 13.

As shown in FIG. 15, the laser beam from the alignment X-measurement interferometer 307 may deviate from the reflection mirror 308 at a certain exposure position during exposure. In such case, in this embodiment, the laser beam to the alignment X-measurement interferometer 307 can be intercepted by the light-shielding plate 309 before it deviates from the reflection mirror 308.

Note that the laser beam can be intercepted by the light-shielding plate 309 as follows. More specifically, when the two interferometers are switched to one another, the two light-shielding plates are removed from positions where they intercept the laser beams, and upon completion of switching, the laser beam of the disabled interferometer is intercepted.

In this embodiment, the light-shielding plates 309 are placed on the upstream of the alignment X-measurement interferometer 307, but may be placed on its downstream side. Also, the full beam size of the laser beam need not be intercepted, and at least only a portion deviating from the reflection mirror 308 may be intercepted.

In the fifth embodiment, X-measurement has been exemplified. However, the present invention is not limited to such specific measurement, and may be applied to a case wherein the exposure optical axis and alignment optical axis have an offset along the X-axis, and an alignment Y-measurement interferometer for performing alignment measurement in the Y-direction is placed.

Sixth Embodiment

Figure 18:
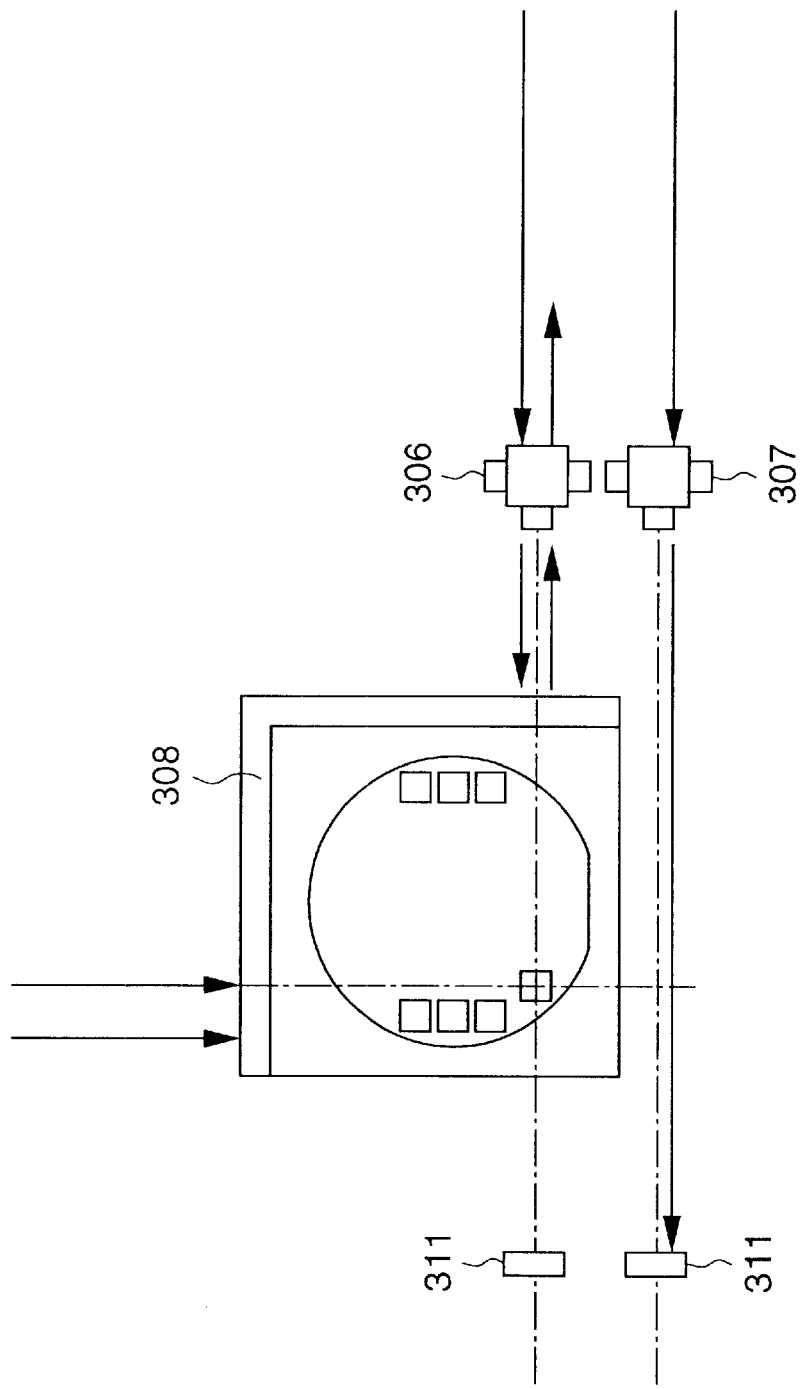
FIG. 18 is a schematic top view of a wafer stage of an exposure apparatus according to the sixth embodiment of the present invention.

FIG. 18 is a schematic top view of a wafer stage of an exposure apparatus according to the sixth embodiment of the present invention. In order to intercept a laser beam deviating from the reflection mirror 308, light-shielding plates 311 are fixed on the downstream of the wafer stage, which is located on the downstream of the exposure X-interferometer and alignment X-interferometer 307. According to this embodiment, since no drive devices for driving the light-shielding plates 311 are required, the arrangement can be simplified.

As described above, according to the fifth and sixth embodiments, even when the exposure optical axis is separated from the measurement optical axis of the alignment optical system, the object on the stage need not be prolonged accordingly.

Furthermore, in the fifth and sixth embodiments, the exposure X-measurement interferometer 306 and alignment X-measurement interferometer 307 are separated nearly equal distances from the reflection mirror 308 on the stage, and upon switching the interferometers, the exposure order of the individual exposure positions on the wafer or alignment measurement order are determined to minimize the distances between these interferometers 306 and 307, and the reflection mirror 308 and the like. For this reason, no extra stage movement is required for reducing errors upon switching, and the throughput of the exposure apparatus can be improved.

Since the interferometer is switched to another when the distance between each of the exposure X-measurement interferometer 306 and alignment X-measurement interferometer 307, and the reflection mirror 308 or the like corresponds to a distance at which the exposure X-measurement interferometer 306 outputs a minimum measurement value of the individual exposure positions of the wafer, or when it is smaller than that distance, the distance measurement value upon switching can be passed with high precision.

Since a laser beam interception means is provided, a laser beam deviating from the reflection mirror is intercepted and can be prevented from emerging outside the exposure apparatus. Hence, an injury to the operator can be prevented.

Embodiment of Device Manufacturing Method

Figure 19:
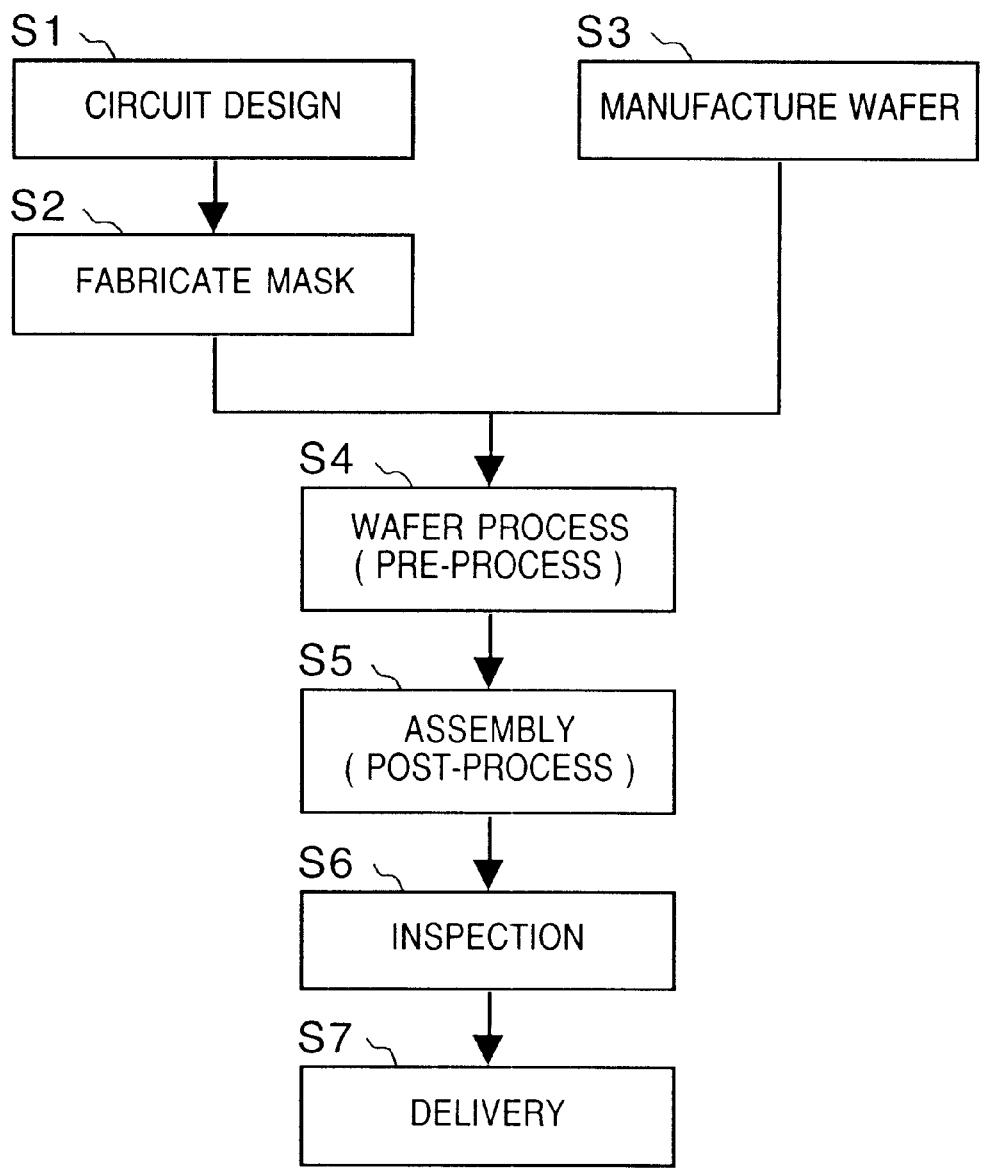
FIG. 19 is a flow chart showing the device manufacturing method that can use an exposure apparatus of the present invention.

An embodiment of a device manufacturing method using the aforementioned exposure apparatus will be explained below. FIG. 19 shows the flow in the manufacture of a microdevice (a semiconductor chip such as an IC, LSI, or the like, liquid crystal panel, CCD, thin film magnetic head, micromachine, or the like). In step S1 (circuit design), the circuit design of a semiconductor device is made. In step S2 (manufacture mask), a mask formed with a designed circuit pattern is manufactured. In step S3 (fabricate wafer), a wafer is fabricated using materials such as silicon, glass, and the like. Step S4 (wafer process) is called a pre-process, and an actual circuit is formed by lithography using the prepared mask and wafer. The next step S5 (assembly) is called a post-process, in which semiconductor chips are assembled using the wafer obtained in step S4, and includes an assembly process (dicing, bonding), a packaging process (encapsulating chips), and the like. In step S6 (inspection), inspections such as operation tests, durability tests, and the like of semiconductor devices assembled in step S5 are run. Semiconductor devices are completed via these processes, and are delivered (step S7).

Figure 20:
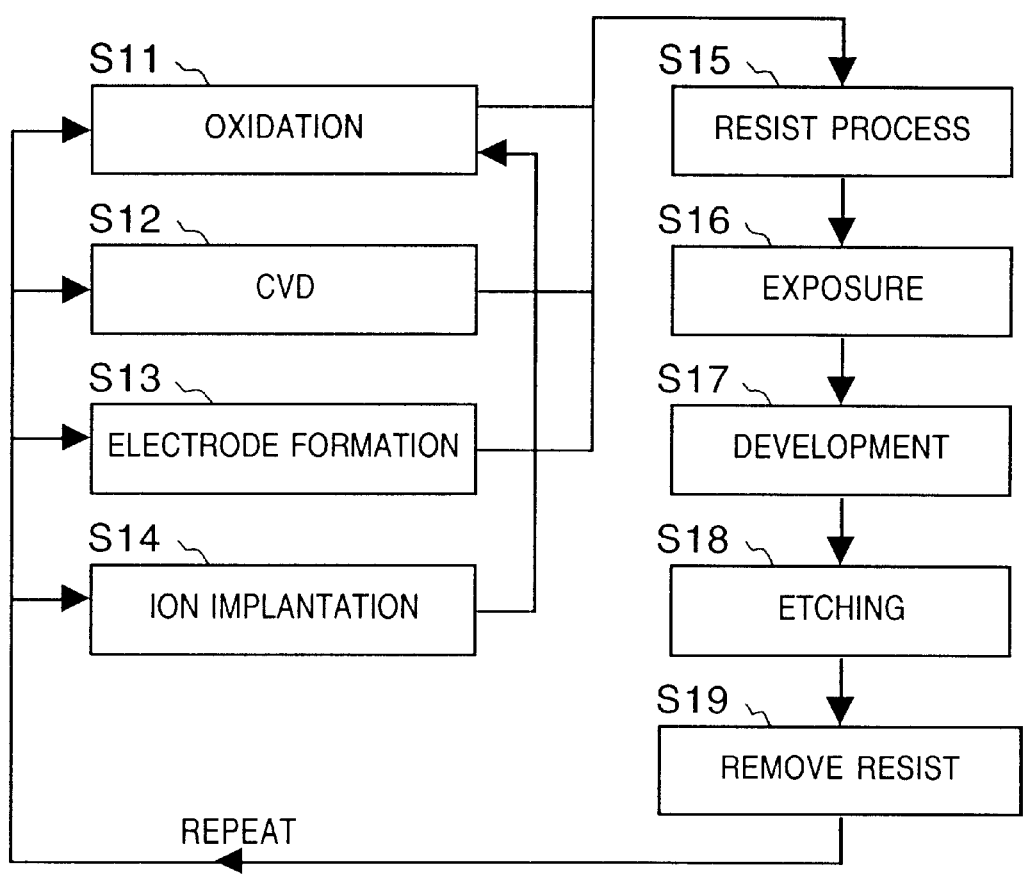
FIG. 20 is a flow chart showing the wafer process shown in FIG. 19 in detail.
Figure 21:
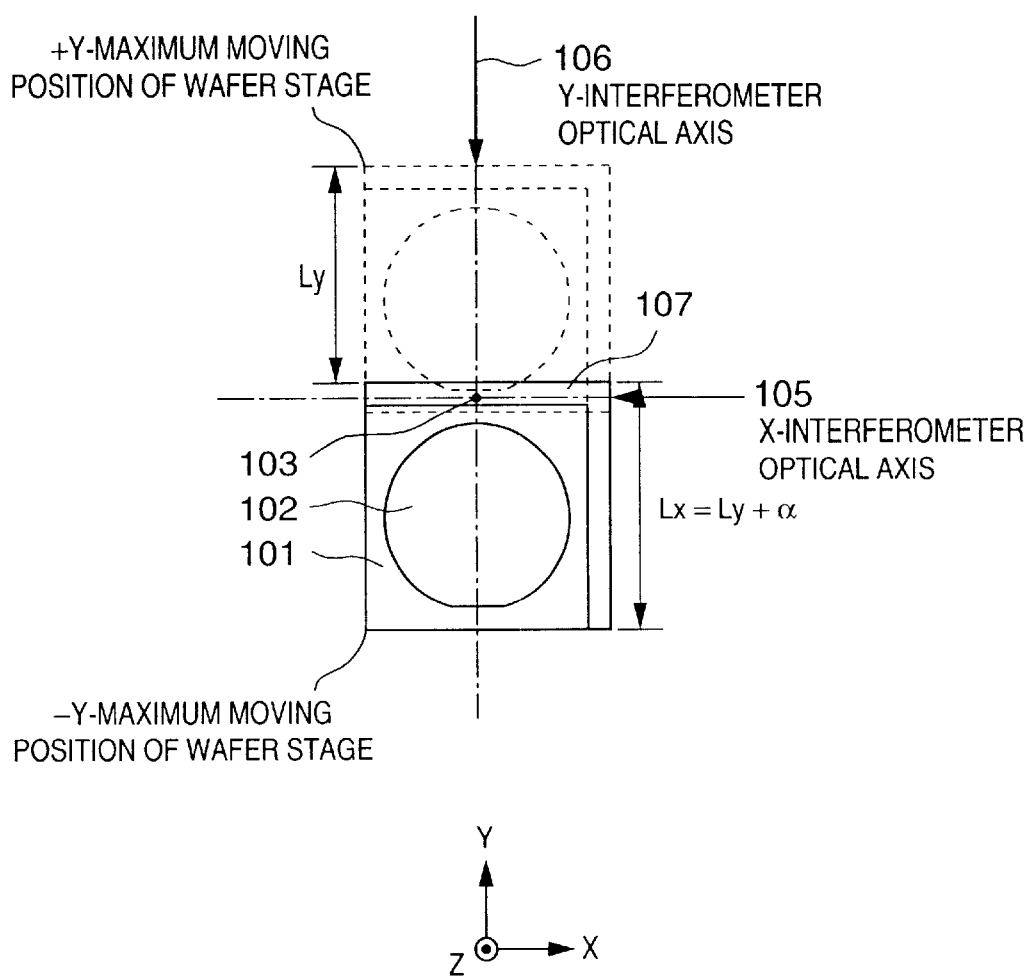
FIG. 21 is a schematic top view of a general wafer stage.
Figure 22:
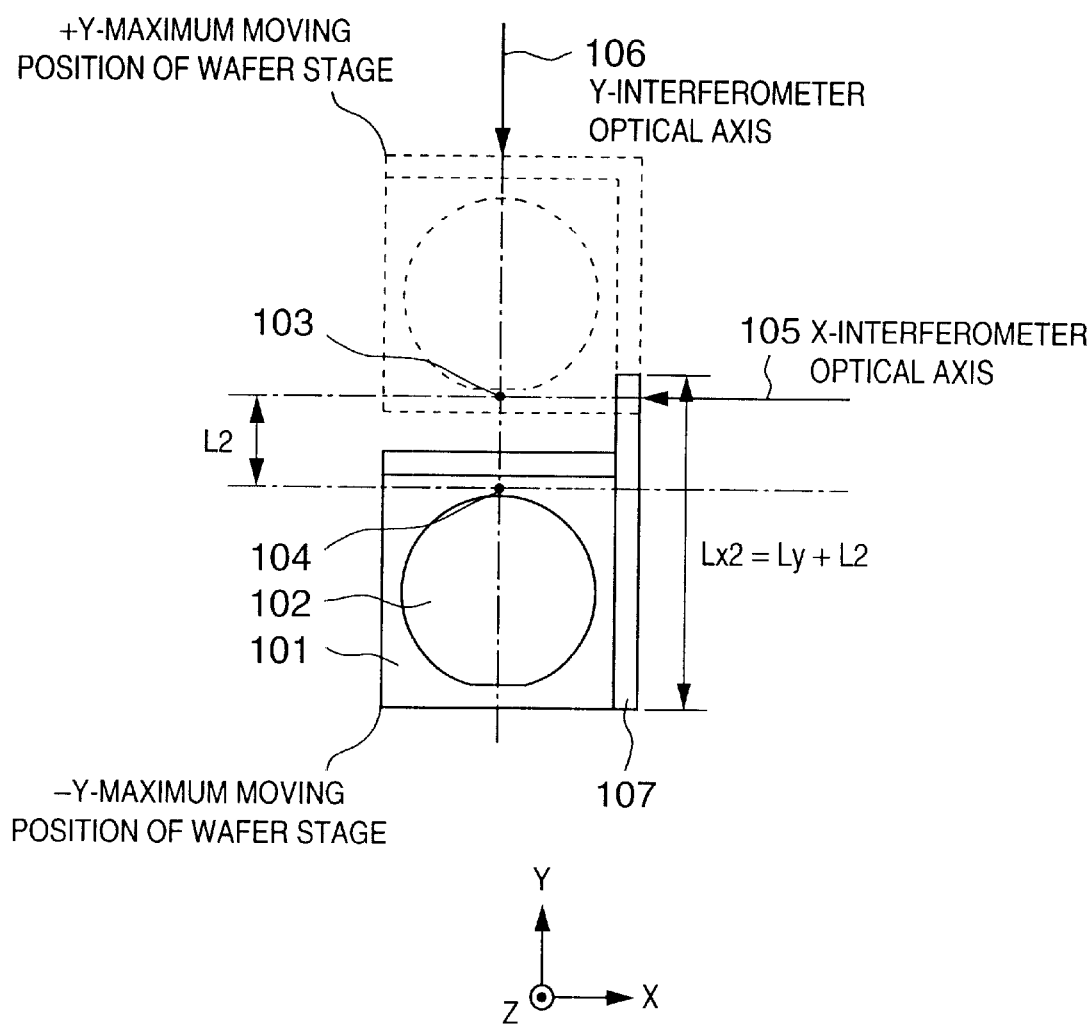
FIG. 22 is a view for explaining the moving range of a stage when the exposure optical axis center does not match the alignment optical axis center in the general wafer stage.

FIG. 20 shows the detailed flow of the wafer process (step S4). In step S11 (oxidation), the surface of the wafer is oxidized. In step S12 (CVD), an insulating film is formed on the wafer surface. In step S13 (electrode formation), electrodes are formed by deposition on the wafer. In step S14 (ion implantation), ions are implanted into the wafer. In step S15 (resist process), a photosensitive agent is applied on the wafer. In step S16 (exposure), the circuit pattern on the mask is printed on the wafer by exposure using the aforementioned exposure apparatus or method. In step S17 (development), the exposed wafer is developed. In step S18 (etching), a portion other than the developed resist image is removed by etching. In step S19 (remove resist), the resist film which has become unnecessary after etching is removed. By repeating these steps, multiple circuit patterns are formed on the wafer.

According to the device manufacturing method of this embodiment, since a long reflection mirror need not be fixed on a wafer stage used upon exposure, exposure can be made by a simple, low-cost apparatus on the basis of satisfactory alignment characteristics, thus efficiently manufacturing devices.

As many apparently widely different embodiments of the present invention can be made without departing from the spirit and scope thereof, it is to be understood that the invention is not limited to the specific embodiments thereof except as defined in the appended claims.

What is claimed is:

1. A stage apparatus comprising:

measurement means having first and second measurement devices for measuring a position of a stage in a first direction, the first measurement device being capable of measuring all positions within a first moving range of the stage, and the second measurement device being capable of measuring all positions within a second moving range of the stage;

execution means for executing a first task done by moving the stage within the first moving range, and a second task done by moving the stage within the second moving range; and switching means for switching the first and second measurement devices during movement of the stage between the first and second tasks so as to use the first measurement device upon executing the first task, and to use the second measurement device upon executing the second task.

2. The apparatus according to claim 1, wherein said switching means inhibits the measurement devices from being switched during execution of each of the first and second tasks.

3. The apparatus according to claim 1, wherein said switching means sets, on the basis of a measurement value of one, which is in use, of the first and second measurement devices, an initial value of the other measurement device upon switching the measurement devices.

4. The apparatus according to claim 1, wherein said switching means acquires a correction value for a measurement value obtained from the measurement device, which is to be used next, on the basis of a difference between the first and second measurement devices, upon switching the measurement devices.

5. A stage apparatus comprising:
a stage which is movable in at least first and second directions;
measurement means having a plurality of measurement devices for measuring a position of said stage in the first direction; and
switching means for switching one of the plurality of measurement devices, which is to be used to measure the position of said stage, to another upon movement of said stage, said switching means switching the measurement devices at different positions upon forward and backward movements of said stage.

6. The apparatus according to claim 5, wherein each of the plurality of measurement devices includes a laser interferometer for irradiating a reflection mirror provided on said stage with a laser beam, and measuring a position on the basis of the light reflected by the reflection mirror.

7. The apparatus according to claim 6, wherein said switching means obtains a correction value for correcting a measurement value of the measurement device after switching on the basis of a plurality of measurement values of the measurement devices before switching.

8. The apparatus according to claim 6, wherein said switching means obtains a correction value for correcting a measurement value after switching on the basis of a difference between measurement values of the measurement device used before switching, and the measurement device used after switching.

9. The apparatus according to claim 6, wherein said switching means calculates a correction value by smoothing a difference between measurement values of the measurement device used before switching, and the measurement device used after switching.

10. The apparatus according to claim 6, further comprising:
detection means for detecting a rotational displacement of said stage in a horizontal plane, and
wherein said switching means calculates a correction value in consideration of the rotational displacement of said stage upon switching the measurement devices.

11. The apparatus according to claim 6, wherein said switching means calculates a correction value in consideration of an influence of any geometric shape error of the reflection mirror.

12. A stage apparatus comprising:
measurement means having first and second measurement devices for measuring a position of a stage in a first direction, the first measurement device being capable of measuring all positions within a first moving range of the stage, the second measurement device being capable of measuring all positions within a second moving range of the stage, and said first and second measurement devices comprising laser interferometers for irradiating a reflection mirror provided on the stage with laser beams and measuring positions on the basis of light reflected by the reflection mirror;
execution means for executing a first task done by moving the stage within the first moving range, and a second task done by moving the stage within the second moving range; and
switching means for switching the measurement device to another so as to use the first measurement device upon executing the first task, and to use the second measurement device upon executing the second task,
wherein an order of the first and second tasks is determined so as to minimize distances between the first and second measurement devices, and the reflection mirror upon completion of the task.

13. The apparatus according to claim 12, further comprising laser beam intercepting means for independently intercepting laser beams which are directed toward the reflection mirror and correspond to the first and second measurement devices.

14. The apparatus according to claim 13, wherein said laser beam intercepting means intercepts the laser beam in correspondence with driving of the stage.

15. The apparatus according to claim 12, wherein said laser beam intercepting means comprises light-shielding plates fixed on a side opposite to laser light sources to sandwich the stage therebetween.

16. An exposure apparatus comprising:
a projection optical system for projecting exposure light, with which a reticle formed with a pattern is irradiated, onto a wafer;
a stage for holding one of the wafer and reticle;
an alignment optical system for outputting alignment light;
measurement means having a plurality of measurement devices which measure positions of said stage in a first direction; and
switching means for switching the measurement device to be used to measure the position of said stage to another device in correspondence with a case wherein said stage is aligned to said projection optical system and a case wherein said stage is aligned to said alignment optical system, wherein said switching means switches the measurement devices while said stage moves between an exposure region and an alignment region.

17. The apparatus according to claim 16, wherein said switching means inhibits switching the measurement devices during execution of a series of tasks for aligning said stage to said projection optical system, and during execution of a series of tasks for aligning said stage to said alignment optical system.

18. The apparatus according to claim 16, wherein said switching means initializes the measurement device to be used next on the basis of a measurement value of the measurement device which is in use, upon switching the measurement devices.

19. The apparatus according to claim 18, wherein said measurement means includes a measurement device for measuring a position of said stage in a second direction perpendicular to the first direction, and
said switching means corrects, upon switching the measurement devices, the measurement value of the position of said stage in the first direction obtained by the measurement device to be used after switching on the basis of measurement values of the positions of said stage in the first and second directions obtained by the measurement device used before switching.

20. The apparatus according to claim 19, wherein said measurement means measures rotation of said stage about a direction perpendicular to the first and second directions as an axis on the basis of a measurement value of a position of said stage in the second direction, and
said switching means corrects the measurement value of the position of said stage in the first direction obtained by the measurement device used after switching in consideration of the rotation.

21. The apparatus according to claim 16, wherein a position where an object mounted on said stage is exchanged can be measured by the same measurement device as the measurement device used to align said stage to said alignment optical system.

22. The apparatus according to claim 16, wherein each of the measurement devices is an interferometer for irradiating a reflection mirror provided on said stage with light, and measuring a position on the basis of light reflected by the reflection mirror.

23. The apparatus according to claim 22, wherein a spacing, in the second direction, between the measurement devices that measure positions of said stage in the first direction is shorter than a length of the reflection mirror in the second direction.

24. The apparatus according to claim 22, wherein measurement light of the interferometer used to align said stage to said projection optical system passes the vicinity of an optical axis of said projection optical system.

25. The apparatus according to claim 22, wherein measurement light of the interferometer used to align said stage to said alignment optical system passes the vicinity of an optical axis of said alignment optical system.

26. The apparatus according to claim 22, wherein said measurement means comprises an interferometer for measuring a position of said stage in a second direction perpendicular to the first direction, and measurement light of the interferometer passes the vicinities of optical axes of said projection optical system and said alignment optical system.

27. The apparatus according to claim 22, wherein the reflection mirror is formed on a side surface of a top plate of said stage.

28. The apparatus according to claim 16, wherein each of the measurement devices is an optical or magnetic encoder for reading a scale provided on said stage.

29. An apparatus comprising:
   a stage which is movable in at least first and second directions;
   measurement means having a plurality of laser interferometers for irradiating a reflection mirror provided on said stage with measurement light, and measuring displacements of said stage in the first direction using light reflected by the reflection mirror, the plurality of laser interferometers having substantially parallel optical axes; and
   switching means for switching one of the plurality of laser interferometers, which is to be used to measure the position of said stage in the first direction, to another upon movement of said stage, said switching means switching the laser interferometers at different positions upon forward and backward movements of said stage.

30. The apparatus according to claim 29, wherein said switching means calculates a correction value for correcting a measurement value of the laser interferometer used after switching on the basis of a measurement value of the laser interferometer used before switching upon switching the laser interferometers.

31. The apparatus according to claim 30, wherein said switching means calculates the correction value in consideration of a measurement error based on any geometric shape error of the reflection mirror upon switching the laser interferometers.

32. The apparatus according to claim 30, wherein said switching means calculates a correction value for correcting a measurement value of the laser interferometer used after switching on the basis of a difference between measurement values of the laser interferometers used before and after switching, upon switching the laser interferometers.

33. The apparatus according to claim 30, wherein said switching means calculates a correction value by smoothing a difference between measurement values of the laser interferometers used before and after switching, upon switching the laser interferometers.

34. The apparatus according to claim 33, wherein said measurement means comprises rotation measurement means for measuring a rotation displacement of said stage about a direction perpendicular to the first and second directions as an axis, and
   said switching means calculates the correction value in consideration of the rotation displacement of said stage upon switching the laser interferometers.

35. An exposure apparatus comprising:
   a projection optical system for projecting exposure light, with which a reticle formed with a pattern is irradiated, onto a wafer;
   a stage, which is movable in at least first and second directions, and holds one of the wafer and reticle;
   an alignment optical system for outputting alignment light;
   measurement means having a plurality of laser interferometers for irradiating a reflection mirror provided on said stage with light, and measuring positions of said stage in the first direction on the basis of light reflected by the reflection mirror; and
   switching means for switching the laser interferometer to be used to measure the position of said stage to another in correspondence with a wafer exposure process for aligning said stage to said projection optical system and an alignment process for aligning said stage to said alignment optical system,
   wherein a process order of the wafer exposure process and the alignment process is determined to minimize distances between the plurality of interferometers and the reflection mirror upon switching the interferometers by said switching means.

36. The apparatus according to claim 35, further comprising intercepting means for independently intercepting laser beams which are output from the respective interferometers toward the reflection mirror.

37. The apparatus according to claim 36, wherein said intercepting means comprises light-shielding means and a drive device for driving said light-shielding means, and changes an intercepting area of the laser beam in correspondence with a position of said stage.

38. The apparatus according to claim 36, wherein said intercepting means comprises light-shielding plates fixed on a side opposite to laser light sources to sandwich the stage therebetween.

39. An exposure apparatus comprising:
   a projection optical system for projecting exposure light, with which a reticle formed with a pattern is irradiated, onto a wafer;
   a stage, which is movable in at least first and second directions, and holds and aligns one of the wafer and reticle;
   an alignment optical system for outputting alignment light;
   measurement means having a plurality of laser interferometers for irradiating a reflection mirror provided on said stage with light, and measuring positions of said stage in the first direction on the basis of light reflected by the reflection mirror; and
   switching means for switching the laser interferometer to be used to measure the position of said stage to another in correspondence with a wafer exposure process for aligning said stage to said projection optical system and an alignment process for aligning said stage to said alignment optical system, wherein said switching means switches the interferometers when a distance between said stage and the reflection mirror is not more than a distance obtained upon outputting a minimum measurement value of the interferometer used in the wafer exposure process.

40. A device manufacturing method including an exposure step of exposing a wafer on which a photosensitive material is coated, the exposing step comprising:

a first step of performing wafer exposure process in which a stage for holding the wafer or reticle is aligned to a projection optical system for projecting exposure light, with which a reticle formed with a pattern is irradiated, onto a wafer;

a second step of performing alignment process where said stage is aligned to an alignment optical system for outputting alignment light; and a switching step of switching a measurement device to be used to measure the position of said stage to another device, in correspondence with a case wherein the first step is performed and a case wherein the second step is performed, wherein, in said switching step, the measurement device is switched at different positions upon forward and backward movements of the stage.

41. A device manufacturing method including an exposure step of exposing a wafer on which a photosensitive material is coated, the exposing step comprising:

a first step of performing a wafer exposure process in which a stage for holding the wafer or recticle is aligned to a projection optical system for projecting exposure light, with which a recticle formed with a pattern is irradiated onto a wafer;

a second step of performing an alignment process in which the stage is aligned to an alignment optical system for outputting alignment light;

a switching step of switching a measurement device to be used to measure the position of the stage to another device in correspondence with a case wherein the first step is performed and a case wherein the second step is performed, wherein the measurement device is an interferometer, and a process order of the wafer exposure process and the alignment process is determined to minimize distances between the inferometer and a reflection mirror upon switching the interferometers in said switching step.

42. A device manufacturing method including an exposure step of exposing a wafer on which a photosensitive material is coated, the exposing step comprising:

a first step of performing a wafer exposure process in which a stage for holding the wafer or recticle is aligned to a projection optical system for projecting exposure light, with which a recticle formed with a pattern is irradiated onto a wafer;

a second step of performing an alignment process in which the stage is aligned to an alignment optical system for outputting alignment light;

a switching step of switching a measurement device to be used to measure the position of the stage to another device in correspondence with a case wherein the first step is performed and a case wherein the second step is performed, wherein the measurement device is an interferometer having a reflection mirror and switching of the measurement device is performed when a distance between the stage and the reflection mirror is not more than a distance obtained upon outputting a minimum measurement value of the interferometer used in the wafer exposure process.

43. An exposure apparatus comprising:

a projection system adapted to project and expose a pattern onto a substrate;

an alignment system adapted to obtain alignment information;

a stage which holds and moves the substrate;

a first measurement device being capable of measuring a position of said stage while said stage is in a first moving range in which position control of said stage by said projection system is performed, and not being capable of measuring a position of said stage while said stage is in a second moving range in which position control of said stage by said alignment system is performed;

a second measurement device being capable of measuring a position of said stage while said stage is in the second moving range, and not being capable of measuring a position of said stage while said stage is in the first moving range; and a switching unit adapted to switch between said first and second measurement devices to be used for position control of said stage while said stage is in a third moving range in which both of said first and second measurement devices are capable of measuring a position of said range.

44. The apparatus according to claim 43, wherein a position of said stage at which said switching unit switches from said first measurement device to said second measurement device is different from a position of said stage at which said switching unit switches from said second measurement device to said first measurement device.

45. The apparatus according to claim 43, wherein said switching unit switches between said first and second measuring devices while the stage is moving.

46. The apparatus according to claim 43, wherein said apparatus executes:

a first task, in which the pattern is projected and exposed on the substrate, when said stage is in the first moving range, and a second task, in which the alignment information is obtained, when said stage is in the second moving range.

47. The apparatus according to claim 46, wherein said switching unit switches between said first and second measurement devices when the first and second tasks are not executed.

48. An exposure apparatus comprising:

a projection system adapted to project and expose a pattern onto a substrate;

an alignment system adapted to obtain alignment information;

a stage which holds and moves the substrate, in a first moving range relating to said projection system, a second moving range relating to said alignement system and between the first and second moving ranges;

a first measurement device being capable of measuring a position of said stage while said stage is in the first moving range and not being capable of measuring a position of said stage while said stage is in the second moving range;

a second measurement device being capable of measuring a position of said stage while said stage is in the second moving range and not being capable of measuring a position of said stage while said stage is in the first moving range; and a switching unit adapted to switch between said first and second measurement devices to be used for position control of said stage while said stage is in a third moving range in which both of said first and second measurement devices are capable of measuring a position of said stage.

49. The apparatus according to claim 48, wherein a position of said stage at which said switching unit switches from said first measurement deivce to said second measurement device is different from a position of said stage at which said switching unit switches from said second measurement device to said first measurement device.

50. The apparatus according to claim 48, wherein said switching unit switches between said first and second measuring devices while the stage is moving.

51. The apparatus according to claim 48, wherein said apparatus executes:

a first task, in which the pattern is projected and exposed on the substrate, when said stage is in the first moving range, and a second task, in which the alignment information is obtained, when said stage is in the second moving range.

52. The apparatus according to claim 51, wherein said switching unit switches between the first and second measurement devices when the first and second tasks are not executed.

* * * * *

UNITED STATES PATENT AND TRADEMARK OFFICE
CERTIFICATE OF CORRECTION

PATENT NO. : 6,495,847 B1
DATED : December 17, 2002
INVENTOR(S) : Toshiya Asano et al.

It is certified that error appears in the above-identified patent and that said Letters Patent is hereby corrected as shown below:

<u>Column 4,</u>
Line 33, "relationship-between" should read -- relationship between --.

<u>Column 5,</u>
Line 4, "and" should be deleted.
Line 7, "stage." should read -- stage; and --.
Line 26, "etc." should read -- etc., --.
Line 60, "lined" should read -- linked --.

<u>Column 7,</u>
Line 31, "hereinafter)" should read -- hereinafter). --.

<u>Column 9,</u>
Line 20, "3112" should read -- S112 --.

<u>Column 11,</u>
Line 35, "separated" should read -- separated by --.
Line 40, "range-of" should read -- range of --.

<u>Column 13,</u>
Line 4, "Y-reader-" should read -- Y-reader --.

<u>Column 14,</u>
Line 62, "paper" should read -- paper and --.

<u>Column 18,</u>
Line 47, "304 Also," should read -- 304. Also, --.

<u>Column 20,</u>
Line 49, "such" should read -- such a --.
Line 60, "on the" should be deleted.

<u>Column 21,</u>
Lines 12 and 13, "on the" should be deleted.

UNITED STATES PATENT AND TRADEMARK OFFICE
CERTIFICATE OF CORRECTION

PATENT NO. : 6,495,847 B1
DATED : December 17, 2002
INVENTOR(S) : Toshiya Asano et al.

It is certified that error appears in the above-identified patent and that said Letters Patent is hereby corrected as shown below:

Column 22,
Line 23, "expoSure" should read -- exposure --.

Column 27,
Line 12, "wafer exposure" should read -- a wafer exposure --.
Lines 38 and 59, "light;" should read -- light; and --.
Line 41, "device" should read -- device, --.

Column 28,
Line 30, "range." should read -- stage. --.

Column 30,
Line 13, "the" should read -- said --.

Signed and Sealed this

Twenty-sixth Day of August, 2003

JAMES E. ROGAN
*Director of the United States Patent and Trademark Office*